(12) United States Patent
Takebayashi et al.

(10) Patent No.: US 9,437,421 B2
(45) Date of Patent: Sep. 6, 2016

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Hitachi Kokusai Electric Inc., Tokyo (JP)

(72) Inventors: Yuji Takebayashi, Toyama (JP); Masakazu Shimada, Toyama (JP); Atsushi Morikawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 160 days.

(21) Appl. No.: 14/162,318

(22) Filed: Jan. 23, 2014

(65) Prior Publication Data

US 2014/0213069 A1 Jul. 31, 2014

(30) Foreign Application Priority Data

Jan. 30, 2013 (JP) .................. 2013-016181
Jan. 15, 2014 (JP) .................. 2014-005264

(51) Int. Cl.
| | |
|---|---|
| *H01L 21/31* | (2006.01) |
| *H01L 21/469* | (2006.01) |
| *C23C 16/00* | (2006.01) |
| *H01L 21/02* | (2006.01) |
| *H01L 21/67* | (2006.01) |
| *C23C 16/40* | (2006.01) |
| *C23C 16/452* | (2006.01) |
| *C23C 16/455* | (2006.01) |

(52) U.S. Cl.
CPC ....... *H01L 21/02233* (2013.01); *C23C 16/405* (2013.01); *C23C 16/452* (2013.01); *C23C 16/45527* (2013.01); *C23C 16/45561* (2013.01); *H01L 21/02189* (2013.01); *H01L 21/02271* (2013.01); *H01L 21/67109* (2013.01); *C23C 16/45578* (2013.01)

(58) Field of Classification Search
None
See application file for complete search history.

(56) References Cited

U.S. PATENT DOCUMENTS

2006/0150905 A1* 7/2006 Sakai .................. C23C 16/455
 118/715
2012/0073500 A1 3/2012 Sato et al.

FOREIGN PATENT DOCUMENTS

CN 101023515 A 8/2007
(Continued)

OTHER PUBLICATIONS

Office Action in corresponding Korean Patent Application No. 10-2014-0008808, mailed on Apr. 25, 2016, along with English Translation.

(Continued)

*Primary Examiner* — Calvin Choi
(74) *Attorney, Agent, or Firm* — Edell, Shapiro & Finnan LLC

(57) ABSTRACT

A substrate processing apparatus includes a process chamber in which a substrate is accommodated; a source gas supply system configured to supply a source gas onto the substrate; first and second reactive gas supply systems configured to supply a reactive gas onto the substrate via first and second interconnected reactive gas supply pipes, wherein a gas storage unit is installed at the second reactive gas supply pipe to store the reactive gas and the reactive gas is supplied onto the substrate via the gas storage unit; and a control unit configured to control the source gas supply system to supply the source gas onto the substrate and to control the first and second reactive gas supply systems to supply the reactive gas onto the substrate via the first and second reactive gas supply pipes.

10 Claims, 11 Drawing Sheets

(56) References Cited

FOREIGN PATENT DOCUMENTS

| | | |
|---|---|---|
| JP | 2010028095 A | 2/2010 |
| JP | 2012134311 A | 7/2012 |
| JP | 2012142367 A | 7/2012 |

OTHER PUBLICATIONS

Office Action in corresponding Chinese Patent Application No. 201410044063.7, mailed on Sep. 17, 2015, along with English translation.

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

FIELD OF THE INVENTION

The present invention relates to a substrate processing apparatus, a method of manufacturing a semiconductor device, and a non-transitory computer-readable recording medium.

BACKGROUND

A technique of forming a film on a substrate by alternately supplying a source gas and a reactive gas as process gases onto the substrate is one of processes included in a process of manufacturing a semiconductor device (see Japanese Patent Laid-open Publication No. 2012-142367 and Japanese Patent Laid-open Publication No. 2012-134311).

As semiconductor devices become finer, surface areas of wafers become increased and more fine treatments are required to form a film in deep grooves or the like. Also, in order to improve the manufacturing throughput of a semiconductor device, the size of a process chamber in which wafers are accommodated becomes greater as wafer sizes become larger or the number of wafers to be processed increases. Thus, the supply rate of a process gas is required to be increased so as to uniformly process such a large-sized wafer.

SUMMARY

It is a main object of the present invention to improve the manufacturing quality and throughput of a semiconductor device.

According to one aspect of the present invention, there is provided a substrate processing apparatus including: a process chamber in which a substrate is accommodated; a source gas supply system configured to supply a source gas onto the substrate; a first reactive gas supply system configured to supply a reactive gas onto the substrate via a first reactive gas supply pipe; a second reactive gas supply system configured to supply the reactive gas onto the substrate via a second reactive gas supply pipe connected to the first reactive gas supply pipe and via a gas storage unit installed at the second reactive gas supply pipe and configured to store the reactive gas; and a control unit configured to control the source gas supply system, the first reactive gas supply system and the second reactive gas supply system to: supply the source gas onto the substrate; and supply the reactive gas onto the substrate via the first reactive gas supply pipe and the second reactive gas supply pipe.

According to the present invention, the quality and manufacturing throughput of a semiconductor device can be improved.

DETAILED DESCRIPTION

Figure 1:
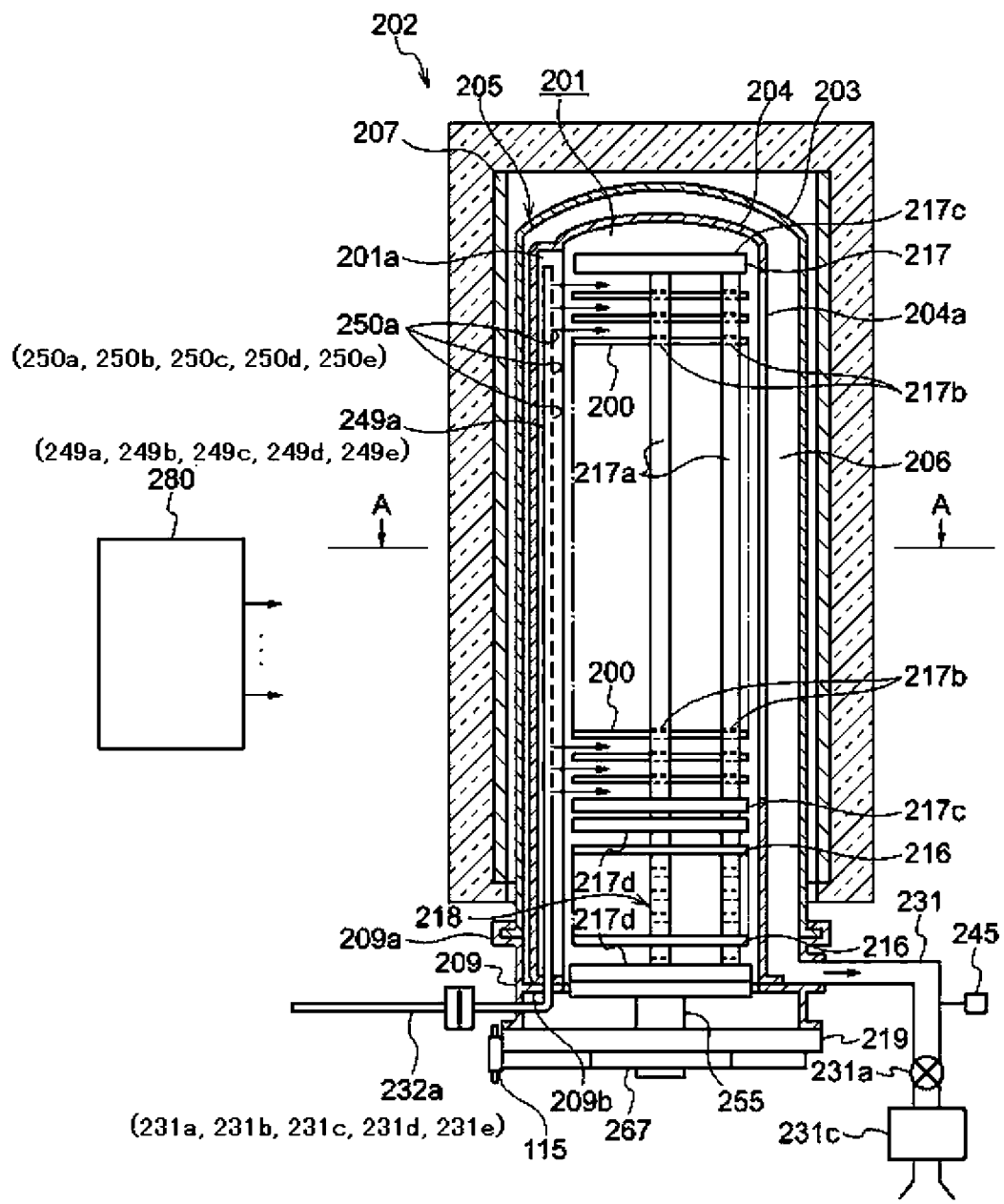
FIG. 1 schematically illustrates a vertical process furnace of a substrate processing apparatus according to an exemplary embodiment of the present invention, in which a vertical cross-sectional view of a portion of the process furnace is illustrated.

Hereinafter, exemplary embodiments of the present invention will be described.

Recently, as integration degrees of semiconductor devices have increased, an insulating film is required to be formed from a thin film when a device is formed. However, tunneling current flows through the insulating film when the insulating film is a thin film. Thus, although it is effective to form the insulating film to a thin thickness, the insulating film actually needs to be formed to a thickness that does not cause a tunneling effect. A high-k film which is an insulating film having a high dielectric constant is an example of such an insulating film. For example, the high dielectric constant of the high-k film may be achieved using a silicon oxide film ($SiO_2$ film) even when the $SiO_2$ film is formed to a thickness of 4.5 nm.

With the introduction of the high-k film, a hafnium oxide film ($HfO_2$ film), a zirconium oxide film ($ZrO_2$ film), or the like is used as an insulating film based on a capacitor of a dynamic random access memory (DRAM). To form one of these films as the insulating film, a method of using a gas, which is obtained by vaporizing an organic high-k compound (an organic compound) using a vaporizer or the like, as a source gas (a first process gas) and ozone gas ($O_3$ gas), which is an oxidizing gas, as a reactive gas (a second process gas), and alternately supplying the source gas and the reactive gas onto a substrate may be used.

However, if this method is used, when a high-k film is formed on the substrate by supplying the reactive gas onto the substrate in a state in which the reactive gas is not sufficiently activated, not only can a desired film forming speed not be achieved but a film thickness also decreases in a central region of a pattern substrate having a trench (groove) structure since a film forming temperature of the organic compound is a low temperature, e.g., about 200 to 300° C. Thus, step coverage may decrease or the pattern may be sparse or dense, thereby causing a variation in a film thickness (a loading effect).

In this case, the supply rate or time of the reactive gas may be increased to increase the film forming speed and improve step coverage or the loading effect. However, in this case, high costs are incurred due to use of ozonizers or a film forming time increases. Consequently, the throughput (productivity) may be lowered or an increase in the consumption rate of sources may result in an increase in manufacturing costs, thereby increasing the cost-of-ownership (COO) (manufacturing cost per piece).

The inventors of the present application have found that these problems may be solved and a fine structure formed on a wafer serving as a substrate or an entire surface of the wafer may be uniformly processed by increasing the supply rates of a plurality of process gases to be supplied into the wafer. Also, as will be described below, the inventors have invented a technique of supplying a process gas for a short time while increasing the supply rate of the process gas to be supplied at a time in order to increase the supply rate of the process gas to be supplied into the wafer without increasing a substrate processing time, e.g., a film forming time.

(First Embodiment)

An exemplary embodiment of the present invention will now be described in detail with reference to the accompanying drawings.

First, a substrate processing apparatus employed in an exemplary embodiment of the present invention will be described. The substrate processing apparatus is configured as an example of a semiconductor device manufacturing apparatus to be used in a process of manufacturing a semiconductor device.

In the following description, a case in which a batch type vertical apparatus capable of performing a film forming process on a plurality of substrates at a time is used as an example of the substrate processing apparatus will be described.

A process furnace 202 of a substrate processing apparatus will be described with reference to FIGS. 1 and 2.

(Process Chamber)

The process furnace 202 includes a vertical process tube 205 disposed in a vertical direction such that a central line of the process tube 205 is vertically arranged, and fixedly supported by a housing (not shown). The process tube 205 includes an inner tube 204 and an outer tube 203. Each of the inner tube 204 and the outer tube 203 is integrally formed in a cylindrical shape using, for example, a heat-resistant material such as quartz ($SiO_2$), silicon carbide (SiC), or a composite material thereof.

The inner tube 204 has a cylindrical shape, the upper end of which is closed and the lower end of which is open. In the inner tube 204, a process chamber 201 in which wafers 200 are accommodated such that they are stacked in a multilayered form and a horizontal posture by a boat 217 serving as a substrate retainer and are processed is formed. A lower end opening of the inner tube 204 is configured as a furnace port via which the boat 217 retaining a group of wafers 200 is entered or ejected. Thus, the internal diameter of the inner tube 204 is set to be greater than the maximum external diameter of the boat 217 retaining the group of wafers 200. The outer tube 203 is partially formed in a concentric shape with the inner tube 204, has a cylindrical shape having the internal diameter that is greater than that of the inner tube 204, a closed upper end, and an open lower end, and covers the inner tube 204 in a concentric form to surround an external side of the inner tube 204. A lower end portion of the outer tube 203 is installed in a flange 209a on a manifold 209 via an O-ring (not shown), and is air-tightly encapsulated with the O-ring. A lower end portion of the inner tube 204 is disposed on a round ring portion 209b in the manifold 209. The manifold 209 is installed to be attachable to/detachable from the inner tube 204 and the outer tube 203 so that the inner tube 204 and the outer tube 203 may be repaired, checked, or cleaned. Since the manifold 209 is supported by the housing, the process tube 205 is vertically installed. A space formed in the outer tube 203 may also be hereinafter referred to as the process chamber 201.

(Exhaust Unit)

An exhaust pipe 231 is connected to a portion of a sidewall of the manifold 209 to exhaust an atmosphere in the process chamber 201. An exhaust port is formed at an interface between the manifold 209 and the exhaust pipe 231 to exhaust the atmosphere in the process chamber 201. The inside of the exhaust pipe 231 communicates with the inside of an exhaust path 206 formed by the space between the inner tube 204 and the outer tube 203 via the exhaust port. A cross-section of the exhaust path has a roughly circular ring shape. Through the exhaust path, the atmosphere in the process chamber 201 may be equally exhausted via an exhaust hole 204a (which will be described below) formed in the inner tube 204 from top to bottom. That is, the atmosphere in the process chamber 201 may be equally exhausted with respect to all of a plurality of wafers 200 placed in the boat 217. At the exhaust pipe 231, a pressure sensor 245, an auto pressure controller (APC) valve 231a serving as a pressure adjustor, and a vacuum pump 231c serving as vacuum exhaust device are sequentially installed in an upstream direction. The vacuum pump 231c is configured to perform vacuum-exhaust so that the side of the process chamber 201 may have a predetermined pressure (degree of vacuum). A controller 280 is electrically connected to the APC valve 231a and the pressure sensor 245. The controller 280 is configured to control the degree of openness of the APC valve 231a based on pressure detected by the pressure sensor 245 such that the pressure in the process chamber 201 reaches a desired pressure at a desired timing. An exhaust unit (exhaust system) according to the present embodiment mainly includes the exhaust pipe 231, the pressure sensor 245, and the APC valve 231a. The exhaust unit may further include the vacuum pump 231c. Also, a trapping device that captures by-products or an unreacted source gas from an exhaust gas or an abatement device that eliminates corrosive or harmful components contained in an exhaust gas may be connected to the exhaust pipe 231. In this case, the exhaust unit may further include the trapping device or the abatement device. The inside of the exhaust pipe 231 may also be referred to as an exhaust line.

(Substrate Retainer)

A seal cap 219 that closes a lower end opening of the manifold 209 abuts the manifold 209 from below in a vertical direction. The seal cap 219 has a disc shape having the external diameter that is equal to or more than the external diameter of the outer tube 203, and is moved vertically in a horizontal posture by a boat elevator 115 (which will be described below) installed vertically outside the process tube 205.

On the seal cap 219, the boat 217 serving as a substrate retaining member (substrate retainer) for retaining the wafers 200 stands vertically to be supported. The boat 217 includes a pair of upper and lower single boards 217c and a plurality of retaining members 217a installed vertically between the single boards 217c. The single boards 217c and the retaining members 217a are formed of a heat-resistant material such as quartz ($SiO_2$), silicon carbide (SiC), or a composite material thereof. A plurality of retaining grooves 217b are installed in each of the retaining members 217a at the same intervals in a lengthwise direction. When circumferential edges of the wafers 200 are inserted into the retaining grooves 217b at the same stages as the retaining members 217a, the wafers 200 are retained to be stacked in a horizontal posture and a multilayered concentric form.

A pair of upper and lower auxiliary single boards 217d are installed between the boat 217 and the seal cap 219 to be supported by a plurality of auxiliary retaining members 218. A plurality of retaining grooves are formed in each of the auxiliary retaining members 218. In the retaining grooves, a plurality of insulating plates 216 having a disc shape and formed of, for example, a heat-resistant material such as quartz ($SiO_2$) or silicon carbide (SiC) are loaded in a multilayered form and a horizontal posture. The insulating plates 216 suppress heat generated from a heater unit 207 which will be described below from being delivered to the manifold 209. Also, the insulating plates 216 may suppress a decrease in a temperature below the wafers 200 placed in the boat 217.

A rotation mechanism 267 is installed at a side of the seal cap 219 opposite to the process chamber 201 to rotate the boat 217. A rotation shaft 255 of the rotation mechanism 267 supports the boat 217 from below while passing through the seal cap 219. By rotating the rotation shaft 255, the wafers 200 may be rotated in the process chamber 201. The seal cap 219 is configured to be moved vertically by the boat elevator 115 serving as a transfer member (transfer mechanism), thereby enabling the boat 217 to be transferred into or out of the process chamber 201.

(Heater Unit)

The heater unit 207 serving as a heating member (heating mechanism) configured to heat the inside of the whole process tube 205 equally or to a predetermined temperature distribution is installed outside the outer tube 203 to surround the outer tube 203. The heater unit 207 is vertically installed by being supported by the housing of the substrate processing apparatus, and configured of, for example, a resistance-heating heater such as a carbon heater. In the process tube 205, a temperature sensor 269 serving as a temperature detector is installed. A heating unit (heating system) according to the present embodiment mainly includes the heater unit 207 and the temperature sensor 269.

(Gas Supply Unit)

At a sidewall of the inner tube 204 (a position that is 180 degrees from the exhaust hole 204a which will be described below), a channel type spare chamber 201a is formed to protrude outward in a radial direction of the inner tube 204 and to extend to be vertically long from the sidewall of the inner tube 204. A sidewall of the spare chamber 201a forms a portion of the sidewalls of the inner tube 204. Also, an inner wall of the spare chamber 201a forms a portion of the inner walls of the process chamber 201. In the spare chamber 201a, nozzles 249a, 249b, 249c, 249d, and 249g configured to supply a gas into the process chamber 201 are installed along an inner wall of the spare chamber 201a (i.e., an inner wall of the process chamber 201) to extend upward from the bottom of the spare chamber 201a in a direction in which the wafers 200 are stacked. That is, the nozzles 249a, 249b, 249c, 249d, and 249g are installed along a wafer arrangement region in which the wafers 200 are arranged, in a region that horizontally surrounds the wafer arrangement region at sides of the wafer arrangement region. Each of the nozzles 249a, 249b, 249c, 249d, and 249g is configured as an L-shaped long nozzle, and includes a horizontal portion passing through the manifold 209 and a vertical portion vertically moving at least from one end of the wafer arrangement region toward the other end thereof. Although FIG. 1 illustrates one nozzle for convenience of explanation, the five nozzles 249a, 249b, 249c, 249d, 249g are actually installed as illustrated in FIG. 2. A plurality of gas supply holes 250a, 250b, 250c, 250d, and 250g are installed in side surfaces of the nozzles 249a, 249b, 249c, 249d, and 249g to supply a gas, respectively. The gas supply holes 250a, 250b, 250c, 250d, and 250g are formed from bottom to top to have opening areas having the same size and inclination at the same opening pitch.

Ends of the horizontal portions of the nozzles 249a, 249b, 249c, 249d, and 249g passing through the manifold 209 are connected outside the process tube 205 to gas supply pipes 232a, 232b, 232c, 232d, and 232g serving as gas supply lines, respectively.

As described above, in a gas supply method according to the present embodiment, a gas is transferred via the nozzles 249a, 249b, 249c, 249d, and 249g disposed in the spare chamber 201a, and is first discharged into the inner tube 204 near the wafers 200 from the gas supply holes 250a, 250b, 250c, 250d, and 250g that open in the nozzles 249a, 249b, 249c, 249d, and 249g, respectively.

For example, the exhaust hole 204a which is a slit type through-hole opens to be slender and long in the vertical direction at a sidewall of the inner tube 204 opposite to the nozzles 249a, 249b, 249c, 249d, and 249g, i.e., a position that is 180 degrees from the spare chamber 201a. The process chamber 201 and the exhaust path 206 formed by the space between the inner tube 204 and the outer tube 203 communicate with each other via the exhaust hole 204a. Thus, a gas supplied into the process chamber 201 from the gas supply holes 250a, 250b, 250c, 250d, and 250g of the nozzles 249a, 249b, 249c, 249d, and 249g flows in the exhaust path 206 via the exhaust hole 204a, flows in the exhaust pipe 231 via the exhaust port, and is then discharged out of the process furnace 202. In this case, the gas supplied near the wafers 200 in the process chamber 201 from the gas supply holes 250a, 250b, 250c, 250d, and 250g flows in a horizontal direction, i.e., a direction parallel to surfaces of the wafers 200, and flows in the exhaust path 206 via the exhaust hole 204a. That is, a main gas flow in the process chamber 201 is the horizontal direction, i.e., the direction parallel to the surfaces of the wafers 200. Accordingly, a gas may be uniformly supplied into the wafers 200 and a thin film may be formed to the same thickness on the wafers 200. However, the exhaust hole 204a is not limited to the slit type through-hole and may be configured with a plurality of holes.

Figure 3:
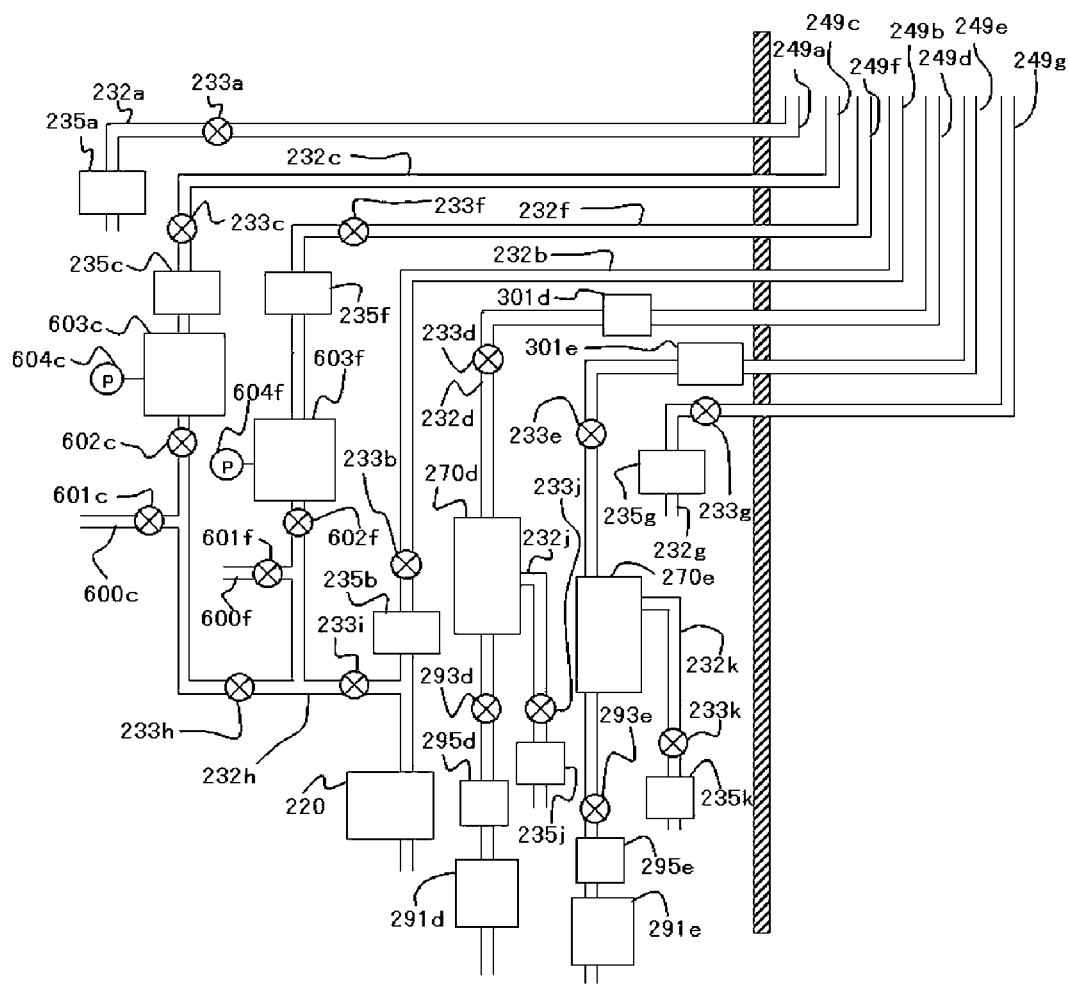
FIG. 3 is a schematic diagram of a source supply system of a substrate processing apparatus according to an exemplary embodiment of the present invention.

Next, a gas supply system according to the present embodiment will be described with reference to FIG. 3.

(Inert Gas Supply System)

At the gas supply pipe 232a, a mass flow controller (MFC) 235a serving as a flow rate control device (a flow rate control unit) and a valve 233a which is an opening/closing valve are sequentially installed in the upstream direction. For example, nitrogen ($N_2$) gas, which is an inert gas, is supplied into the process chamber 20a via the gas supply pipe 232a and the nozzle 249a. A first inert gas supply system mainly includes the nozzle 249a, the gas supply pipe 232a, the MFC 235a, and the valve 233a.

At the gas supply pipe 232g, an MFC 235g serving as a flow rate control device (a flow rate control unit) and a valve 233g which is an opening/closing valve are sequentially installed in the upstream direction. For example, nitrogen ($N_2$) gas which is an inert gas is supplied into the process chamber 20a via the gas supply pipe 232g and the nozzle 249g. A second inert gas supply system mainly includes the nozzle 249g, the gas supply pipe 232g, the MFC 235g, and the valve 233g.

An inert gas supply system includes one of or both the first inert gas supply system and the second inert gas supply system. Although the first inert gas supply system and the second inert gas supply system may be individually used to process substrates, the substrates may be uniformly processed when both the first inert gas supply system and the second inert gas supply system are used. Also, as illustrated in FIG. 2, the nozzle 249a and the nozzle 249g are preferably disposed such that another nozzle is interposed therebetween, thereby improving the uniformity of processing the wafers 200. However, the inert gas supply system need not be installed.

(Reactive Gas Supply System)

At the gas supply pipe 232b, an ozonizer 220 which is an ozone generator serving as a reactive gas activation device, a valve 233b which is an opening/closing valve, an MFC 235b which is a flow rate controller (a flow rate control unit), and a valve 233b which is an opening/closing valve are sequentially installed in the upstream direction. The nozzle 249b described above is connected to a front end of the gas supply pipe 232b.

An upstream side of the gas supply pipe 232b is connected to an oxygen gas source (not shown) that supplies, for example, oxygen ($O_2$) gas, which is an oxidizing gas, as a reactive gas. $O_2$ gas supplied to the ozonizer 220 changes into ozone ($O_3$) gas, which is an oxidizing gas and serves as a first reactive gas, and is supplied into the process chamber 201. A first reactive gas supply system (which may also be referred to as a first oxidizing gas supply system or a first process gas supply system) mainly includes the nozzle 249b, the gas supply pipe 232b, the MFC 235b, and the valve 233b. The first reactive gas supply system may further include the ozonizer 220.

The inventors of the present application found that a fine structure formed on the wafer 200 or all surfaces of the wafer 200 can be uniformly processed by increasing the supply rate of $O_3$ gas to be supplied into the wafer 200. Also, in this case, a plurality of wafers can be uniformly processed even when the plurality of wafers are processed at the same time.

A plurality of the ozonizers 220 described above may be used to increase the supply rate of $O_3$ gas to be supplied into the wafer 200. However, since the ozonizer 220 is very expensive, high costs are incurred when the plurality of the ozonizers 220 are used. Thus, a second reactive gas supply system including gas tanks 603c and 604c may be installed instead of the plurality of ozonizers 220, thereby saving on costs. The structure of the second reactive gas supply system will be described below.

A gas supply pipe 232h is connected to an upstream side of the MFC 235b of the gas supply pipe 232b, and the gas supply pipe 232c is connected to the gas supply pipe 232h. At the gas supply pipe 232c, a vent line 600c which is an abatement line configured to exhaust a gas to an ozone killer (not shown) serving as a deactivation mechanism (an abatement mechanism) configured to deactivate $O_3$ gas, a valve 601c configured to control supply of a gas to the ozone killer to be 'on'/'off', a valve 602c, the gas tank (ozone storage mechanism) 603c serving as a gas storage unit configured to store a gas, a pressure sensor 604c configured to measure the pressure in the gas tank 603c, an MFC 235c, and a valve 233c are sequentially installed in the upstream direction. The flow of the gas is stored until, for example, $O_3$ gas generated by the ozonizer 220 is supplied to the gas tank 603c through the gas supply pipe 232c via the gas supply pipes 232b and 232h and the pressure in the gas tank 603c reaches a predetermined pressure. After the flow rate of the $O_3$ gas from the gas tank 603c is adjusted using the MFC 235c, the $O_3$ gas is supplied into the process chamber 201 via the valve 233c. A second reactive gas supply system (which may also be referred to as a second oxidizing gas supply system or a second process gas supply system) mainly includes the nozzle 249c, the gas supply pipe 232c, the MFC 235c, the valve 233b, the gas tank 603c, and the pressure sensor 604c. Also, remnant $O_3$ gas generated when the pressure in the gas tank 603c is greater than the predetermined pressure is exhausted to the ozone killer using the valves 601c and 602c and the vent line 600c without passing the process chamber 201, if needed.

A reactive gas supply system includes the first reactive gas supply system and the second reactive gas supply system. The reactive gas supply system may also be referred to as an ozone supply mechanism.

(Source Gas Supply System)

A vaporizer 270d which is a vaporizing device (vaporizer unit) and vaporizes a liquid source into a vapor gas serving as a source gas (first source gas) is installed at the gas supply pipe 232d. A valve 233d which is an opening/closing valve and a gas filter 301d are sequentially installed at the vaporizer 270d in a downstream direction. Also, the vaporizer 270d is kept at a temperature according to a liquid source to be used. The nozzle 249d is connected to a front end of the gas supply pipe 232d. By opening the valve 233d, vapor gas generated in the vaporizer 270d is supplied into the process chamber 201 via the nozzle 249d. A source gas supply system (which may also be referred to as a first source gas supply system or a third process gas supply system) mainly includes the nozzle 249d, the valve 233d, the gas supply pipe 232d, and the gas filter 301d. The vaporizer 270d may be further included in the source gas supply system.

Also, a liquid source supply system or a carrier gas supply system which will be described below may be further included in the source gas supply system.

(Liquid Source Supply System)

A liquid source tank 291d, a liquid flow rate control device (LMFC) 295d, and a valve 293d are installed at the gas supply pipe 232d upstream from the vaporizer 270d from the upstream end. The supply rate of a liquid source into the vaporizer 270d (i.e., the supply flow rate of a vapor gas vaporized in the vaporizer 270d and supplied into the process chamber 201) is controlled by the LMFC 295d. A liquid source supply system (first liquid source supply system) mainly includes the gas supply pipe 232d, the LMFC 295d, and the valve 293d. The liquid source tank 291d may be further included in the liquid source supply system.

(Carrier Gas Supply System)

An inert gas (e.g., $N_2$ gas) is supplied as a carrier gas to the vaporizer 270d from a gas supply pipe 232j. An MFC 235j and a valve 233j are installed at the gas supply pipe 232j. The uniformity of processing the wafers 200 such as the uniformity of a film thickness between the wafers 200 loaded in the boat 217 may be adjusted by diluting a vapor gas generated from the vaporizer 270d using the carrier gas.

A carrier gas supply system (first carrier gas supply system) mainly includes the gas supply pipe 232j, the MFC 235j, and the valve 233j.

For example, a zirconium source gas serving as a source gas which is a metal containing gas, i.e., a gas containing a zirconium (Zr) element (a zirconium containing gas), is supplied as a first source gas into the process chamber 201 from the gas supply pipe 232d via the LMFC 295d, the vaporizer 270d, the gas filter 301d, the nozzle 249d, and the like. For example, tetrakis(ethylmethylamino)zirconium (Zr[N(CH$_3$)C$_2$H$_5$]$_4$, abbreviated as 'TEMAZ') may be used as the zirconium containing gas. The TEMAZ is in a liquid state at normal temperature and pressure. The TEMAZ that is in the liquid state is stored as a liquid source in the liquid source tank 291d. Also, in this case, the vaporizer 270d is maintained to have a temperature appropriate for the TEMAZ, e.g., to be in a state in which the vaporizer 270d is heated to 120 to 150° C.

(Control Unit)

Figure 4:
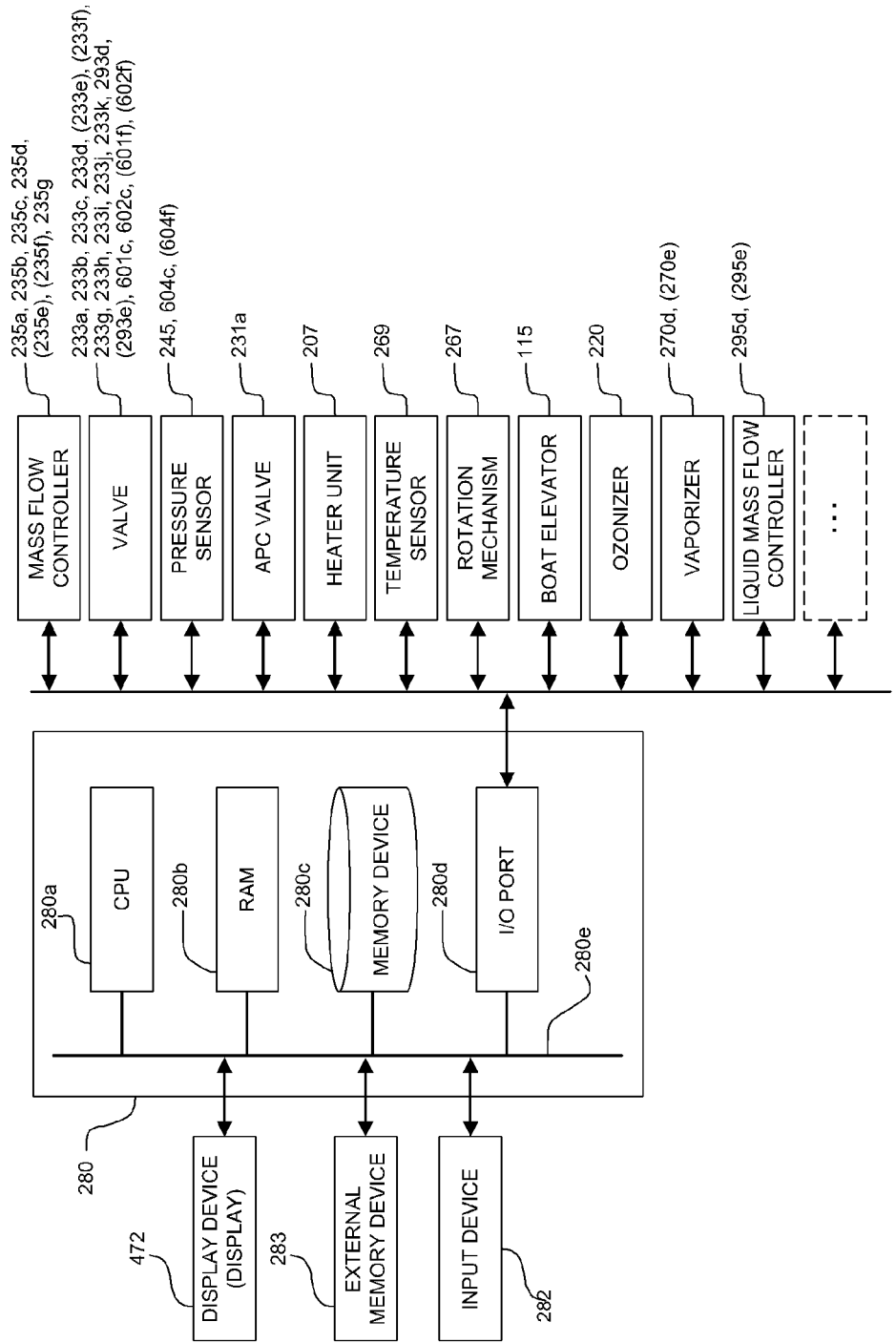
FIG. 4 is a schematic diagram of a controller of a substrate processing apparatus according to an exemplary embodiment of the present invention.

FIG. 4 is a schematic diagram illustrating a connection between a control unit and various elements of a substrate processing apparatus according to an exemplary embodiment of the present invention. The controller 280 which is a control unit (control member) is configured as a computer including a central processing unit (CPU) 280a, a random access memory (RAM) 280b, a memory device 280c, and an input/output (I/O) port 280d. The RAM 280b, the memory device 280c, and the I/O port 280d are configured to exchange data with the CPU 280a via an internal bus 280e. An I/O device 282 configured, for example, as a touch panel or the like is connected to the controller 280.

The memory device 280c is configured as, for example, a flash memory, a hard disk drive (HDD), or the like. In the memory device 280c, a control program for controlling an operation of a substrate processing apparatus, a process recipe including an order or conditions of substrate processing which will be described below, or the like is stored to be readable. The process recipe is a combination of sequences of a substrate processing process which will be described below to obtain a desired result when the sequences are performed by the controller 280, and acts as a program. Hereinafter, the process recipe, the control program, etc. will be referred to together simply as a 'program.' Also, when the term 'program' is used in the present disclosure, it should be understood as including only a process recipe, only a control program, or both of the process recipe and the control program. The RAM 280b is configured as a memory area (work area) in which a program or data read by the CPU 280a is temporarily stored.

The I/O port 280d is connected to the MFCs 235a, 235b, 235c, 235d, and 235g, the valves 233a, 233b, 233c, 233d, 233g, 233h, 233i, 233j, 233k, 293d, 601c, and 602c, the pressure sensors 245 and 604c, the APC valve 231a, the vacuum pump 231c, the heater unit 207, the temperature sensor 269, the rotation mechanism 267, the boat elevator 115, the ozonizer 220, the vaporizer 270d, the LMFC 295d, etc.

The CPU 280a reads and executes the control program from the memory device 280c, and reads the process recipe from the memory device 280c according to a manipulation command received via the I/O device 282. Also, according to the read process recipe, the CPU 280a is configured to control flow rates of various gases using the MFCs 235a, 235b, 235c, 235d, and 235g; control the flow rate of a liquid source using the LMFCs 295d and 295e; control opening/closing of the valves 233a, 233b, 233c, 233d, 233g, 233h, 233i, 233j, 233k, 293d, 293e, 601c, and 602c; control the pressures in the gas tanks 603c and 604c using the pressure sensor 604c; control the degree of pressure by opening/closing the APC valve 231a and based on the pressure sensor 245 using the APC valve 231a; control the temperature using the heater unit 207 based on the temperature sensor 269; control driving/suspending of the vacuum pump 231c; control the rotation and rotation speed of the boat 217 using the rotation mechanism 267; control upward/downward movement of the boat 217 using the boat elevator 115, etc.

The controller 280 is not limited to a dedicated computer and may be configured as a general-purpose computer. For example, the controller 280 according to the present embodiment may be configured by preparing an external memory device 283 storing a program as described above, e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) flash memory, a memory card, etc.), and then installing the program in a general-purpose computer using the external memory device 283. Also, means for supplying a program to a computer are not limited to using the external memory device 283. For example, a program may be supplied to a computer using communication means, e.g., the Internet or an exclusive line, without using the external memory device 123. The memory device 280c or the external memory device 283 may be configured as a non-transitory computer-readable recording medium. Hereinafter, the memory device 280c and the external memory device 283 may also be referred to together simply as a 'recording medium.' Also, when the term 'recording medium' is used in the present disclosure, it may be understood as only the memory device 280c, only the external memory device 283, or both of the memory device 280c and the external memory device 283.

(Substrate Processing Process)

Next, an example of a sequence of forming a metal oxide film that is a high-k film, for example, a zirconium oxide film (ZrO$_2$) (which may also be referred to as a 'ZrO' film below), as an insulating film on a substrate using the process furnace 202 of the substrate processing apparatus described above will be described as a process included in a process of manufacturing a semiconductor device (a device) with reference to FIGS. 5 and 6 below. In the following description, the operations of various elements of the substrate processing apparatus are controlled by the controller 280.

When the term 'wafer' is used in the present disclosure, it should be understood as either the wafer itself, or both the wafer and a stacked structure (assembly) including a layer/film formed on the wafer (i.e., the wafer and the layer/film formed thereon may also be referred to collectively as the 'wafer'). Also, when the expression 'surface of the wafer' is used in the present disclosure, it should be understood as either a surface (exposed surface) of the wafer itself or a surface of a layer/film formed on the wafer, i.e., an uppermost surface of the wafer as a stacked structure.

Thus, in the present disclosure, the expression 'specific gas is supplied into a wafer' should be understood to mean that the specific gas is directly supplied to a surface (exposed surface) of the wafer or that the specific gas is supplied to a surface of a layer/film on the wafer, i.e., to the uppermost surface of the wafer as a stacked structure. Also, in the present disclosure, the expression 'a layer (or film) is formed on the wafer' should be understood to mean that the layer (or film) is directly formed on a surface (exposed surface) of the wafer itself or that the layer (or film) is formed on the layer/film on the wafer, i.e., on the uppermost surface of the wafer as a stacked structure.

Also, in the present disclosure, the term 'substrate' has the same meaning as the term 'wafer.' Thus, the term 'wafer' may be used interchangeably with the term 'substrate.'

A substrate processing process will now be described.

Figure 2:
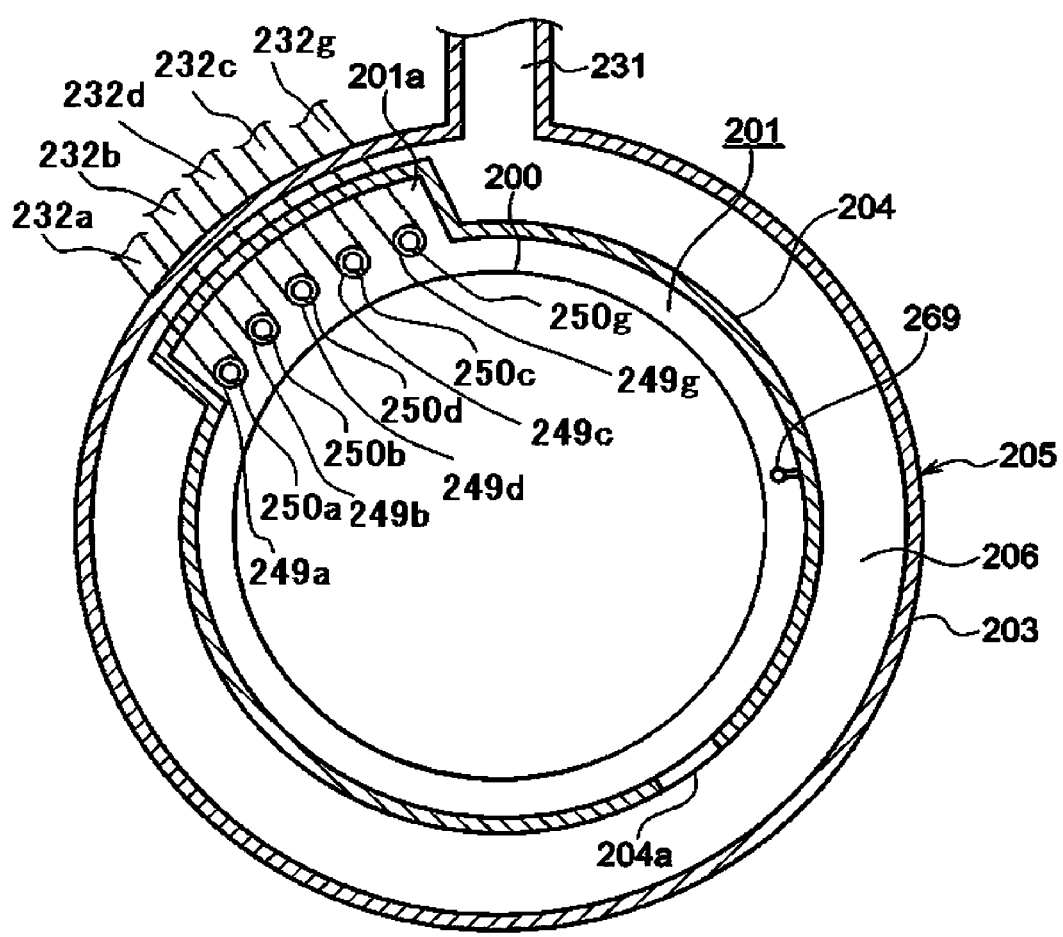
FIG. 2 is a schematic cross-sectional view taken along line A-A of a process furnace portion of the vertical process furnace of FIG. 1.
Figure 5:
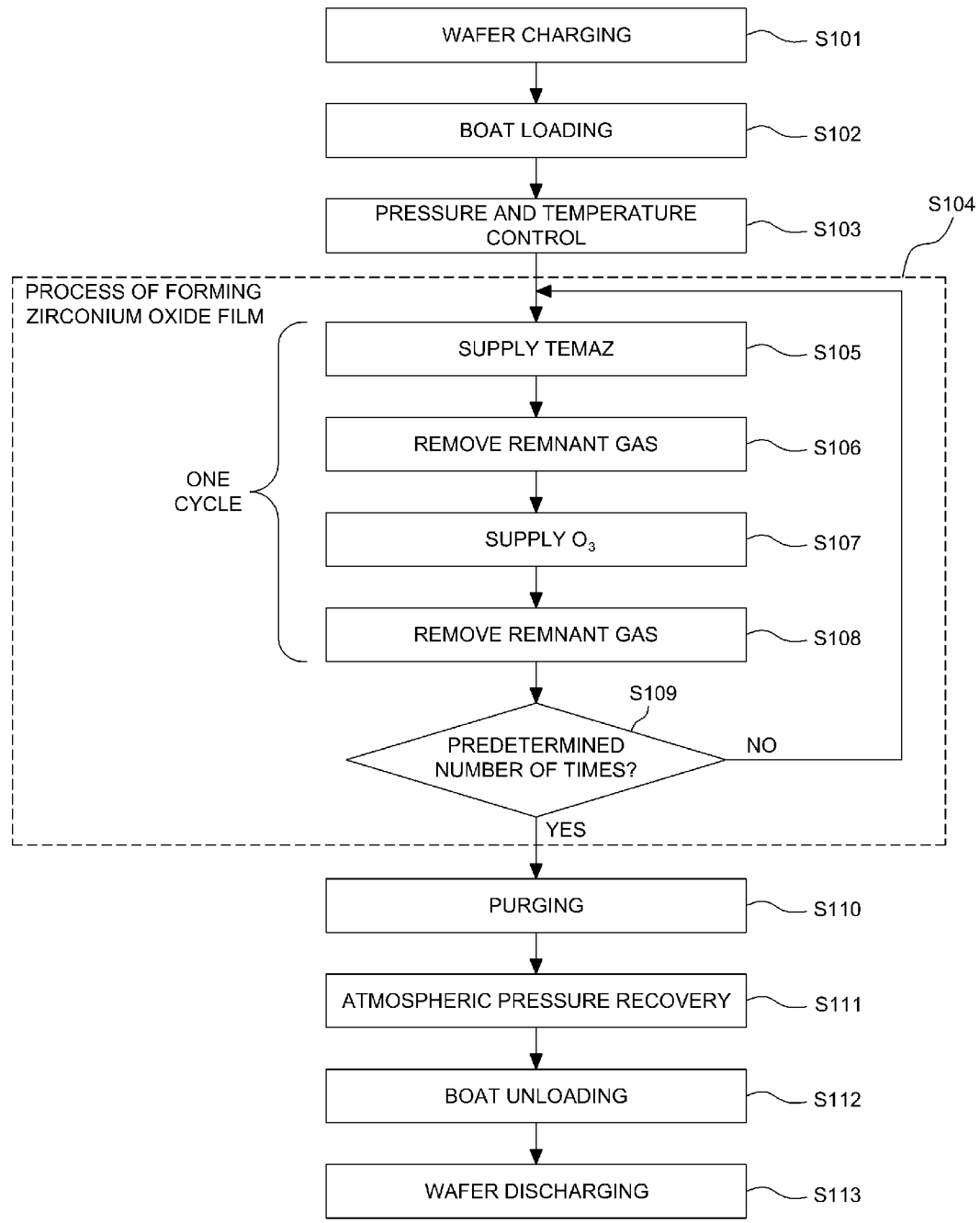
FIG. 5 is a flowchart of a process of forming a zirconium oxide film using a substrate processing process according to an exemplary embodiment of the present invention.

First, when a plurality of wafers 200 are loaded in the boat 217 (wafer charging) (see step S101 of FIG. 5), the boat 217 supporting the plurality of wafers 200 is lifted by the boat elevator 115 and loaded into the process chamber 201 (boat loading) as illustrated in FIG. 1 (see step S102 of FIG. 5). In this state, the lower end of the manifold 209 is air-tightly closed by the seal cap 219.

The inside of the process chamber 201 is vacuum-exhausted to have a desired pressure (degree of vacuum) by the vacuum pump 231c. In this case, the pressure in the process chamber 201 is measured by the pressure sensor 245, and the APC valve 231a is feedback-controlled based on the measured pressure (pressure control) (see step S103 of FIG. 5). Also, the inside of the process chamber 201 is heated to a desired temperature by the heater unit 207. In this case, an amount of electric current supplied to the heater unit 207 is feedback-controlled based on temperature information detected by the temperature sensor 269, so that the inside of the process chamber 201 may have a desired temperature distribution (temperature control) (see step S103 of FIG. 5). Then, the boat 217 is rotated by the rotation mechanism 267 to rotate the wafers 200.

The vacuum pump 246 continues operating at least until processing of the wafers 200 is completed. Also, the wafers in the process chamber 201 are heated to a desired temperature by the heater unit 207. Also, the inside of the process chamber 201 is heated to a desired temperature by the heater unit 207. In this case, an amount of electric current supplied to the heater unit 207 is feedback-controlled based on temperature information detected by the temperature sensor 269, so that the inside of the process chamber 201 may have a desired temperature distribution (temperature control). The heating of the inside of the process chamber 201 by the heater unit 207 is continuously performed at least until the processing of the wafers 200 is completed. Then, rotation of the boat 217 and the wafers 200 by the rotation mechanism 267 begins. Also, the rotation of the boat 217 and the wafers 200 by the rotation mechanism 267 is continuously performed at least until the processing of the wafers 200 is completed.

Next, an insulating film forming process of forming a ZrO film as an insulating film by supplying TEMAZ gas and $O_3$ gas into the process chamber 201 is performed (see step S104 of FIG. 5). In the insulating film forming process, four steps which will be described below are sequentially performed.

(ZrO Film Forming Process)
<Step S105>

In step S105 (see FIGS. 5 and 6, a first process or a TEMAZ supply process), first, TEMAZ gas is supplied. The TEMAZ gas is supplied into the gas supply pipe 232d via the vaporizer 270d and the gas filter 301d by opening the valve 233d of the gas supply pipe 232d. The flow rate of the TEMAZ gas flowing in the gas supply pipe 232d is adjusted by the LMFC 295d. The flow rate controlled TEMAZ gas is supplied into the process chamber 201 from the gas supply hole 250d of the nozzle 249d, and exhausted from the gas the exhaust pipe 231. At the same time, the valve 233j is opened to supply an inert gas such as $N_2$ gas into the inert gas supply pipe 232j. The flow rate of the $N_2$ gas flowing in the inert gas supply pipe 232j is adjusted by the MFC 235j. The flow rate adjusted $N_2$ gas is supplied into the process chamber 201 together with the TEMAZ gas, and exhausted from the gas exhaust pipe 231. Also, the valve 233a is opened to supply an inert gas such as $N_2$ gas from the gas supply pipe 232a, the nozzle 249a, and the gas supply hole 250a, and the valve 233g is opened to supply an inert gas such as $N_2$ gas from the gas supply pipe 232g, the nozzle 249g, and the gas supply hole 250g.

In this case, the pressure in the process chamber 201 is set to be, for example, in the range of 20 to 500 Pa by appropriately controlling the APC valve 231a. The supply flow rate of the TEMAZ gas controlled by the LMFC 295d is set to be, for example, in the range of 0.1 to 0.5 g/min. A duration for which the wafers 200 are exposed to the TEMAZ gas, i.e., a gas supply time (radiation time), is set to be, for example, in the range of 10 to 300 seconds. In this case, the temperature of the heater unit 207 is set such that the temperatures of the wafers 200 are, for example, in the range of 150 to 300° C. When the TEMAZ gas is supplied, a zirconium (Zr) containing layer is formed on the wafers 200.

<Step S106>

In step S106 (see FIGS. 5 and 6, a second process), the valve 233d is closed to stop the supply of the TEMAZ gas into the process chamber 201. In this case, the inside of the process chamber 201 is vacuum-exhausted using the vacuum pump 231c in a state in which the APC valve 231a of the exhaust pipe 231 is open, thereby eliminating from the process chamber 201 the TEMAZ gas that does not react or remains after contributing to the formation of the zirconium containing layer.

In this case, the $N_2$ gas is continuously supplied as the inert gas into the process chamber 201 in a state in which the valve 233g is open. The $N_2$ gas acts as a purge gas to increase the effect of eliminating from the process chamber 201 the TEMAZ gas that does not react or remains after contributing to the formation of the zirconium containing layer.

In this case, the gas remaining in the process chamber 201 may not be completely eliminated and the inside of the process chamber 201 may not be completely purged. When a small amount of gas remains in the process chamber 201, step S107 to be performed thereafter will not be badly influenced by the gas. In this case, the flow rate of the $N_2$ gas to be supplied into the process chamber 201 need not be high. For example, the inside of the process chamber 201 may be purged without causing step S107 to be badly influenced by the gas by supplying an amount of a gas corresponding to the capacity of the reaction tube (particularly, the process chamber 201). As described above, when the inside of the process chamber 201 is not completely purged, a purge time may be reduced to improve the throughput. Furthermore, the consumption of the $N_2$ gas may be suppressed to a necessary minimum level.

Figure 6:
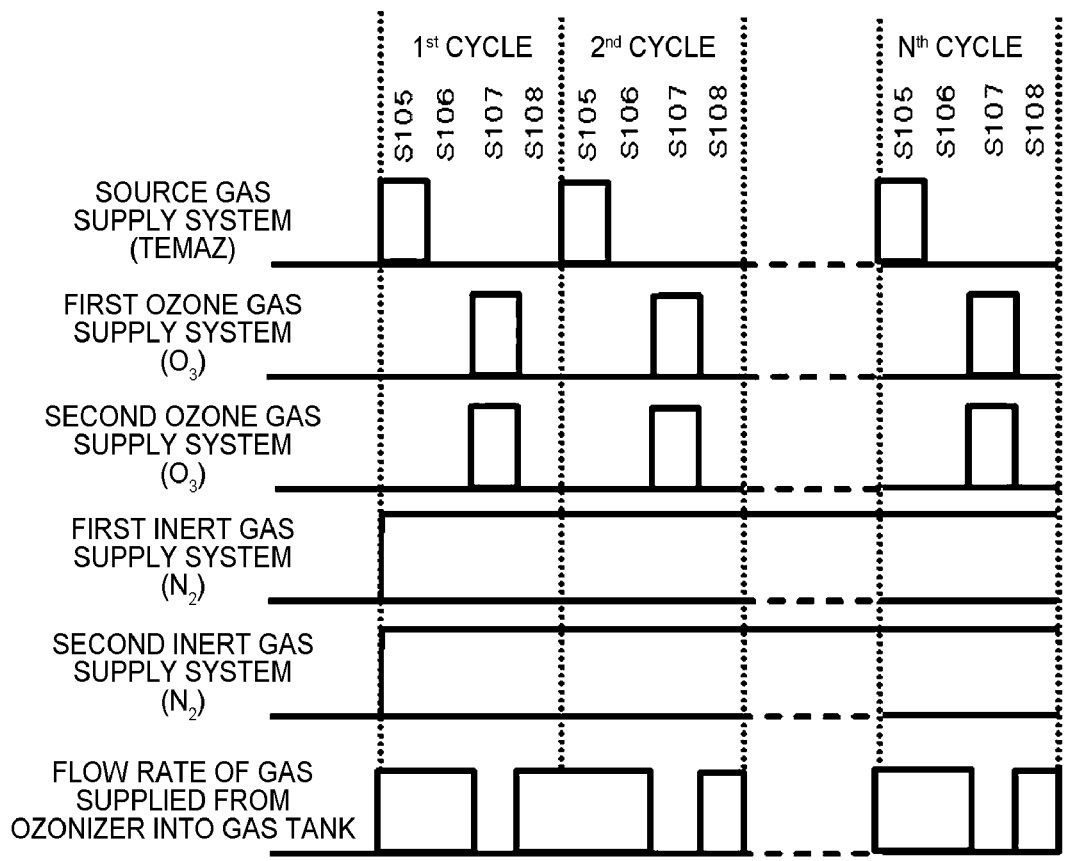
FIG. 6 is a timing chart of a process of forming a zirconium oxide film using a substrate processing apparatus according to an exemplary embodiment of the present invention.
Figure 7:
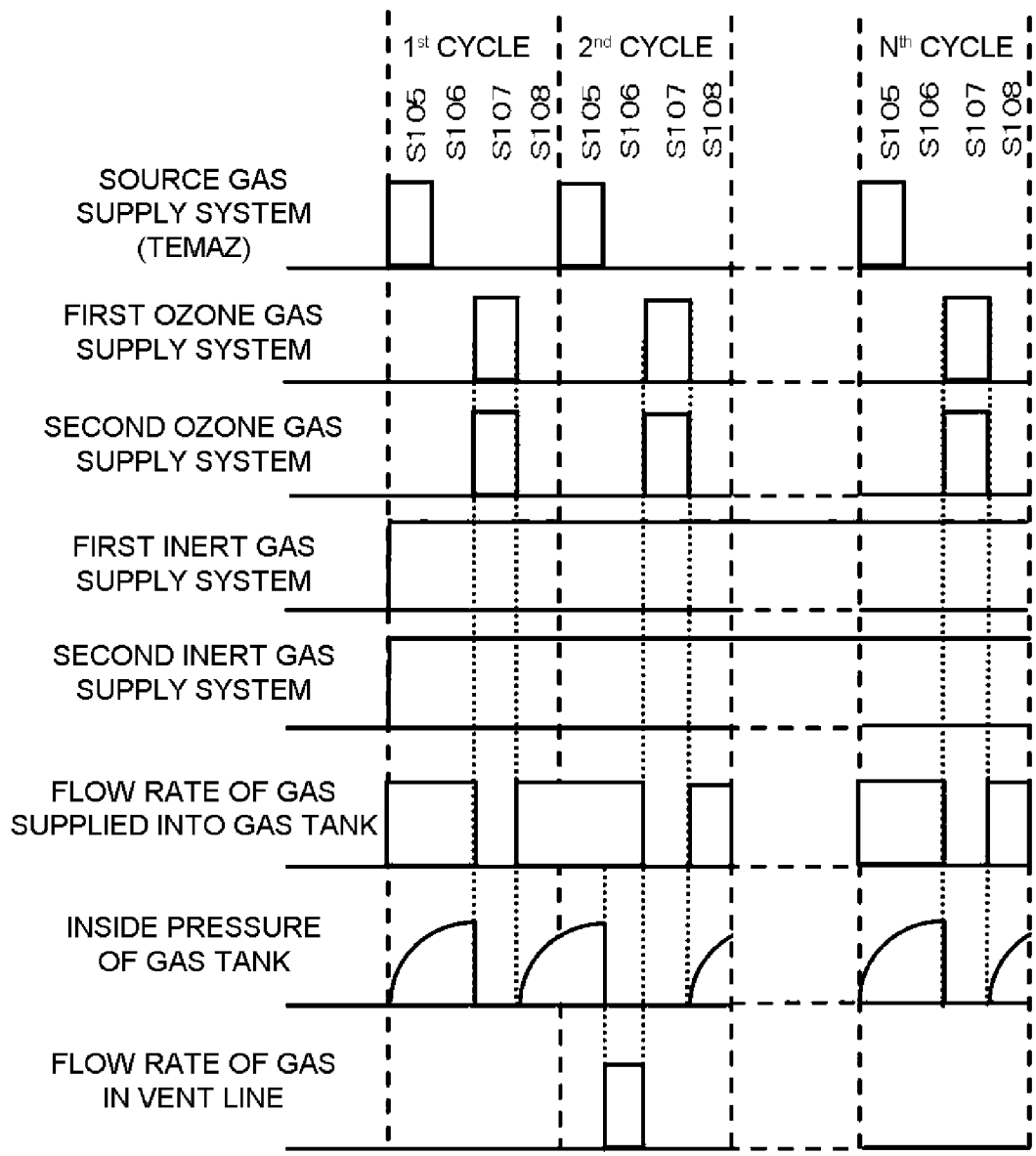
FIG. 7 is a timing chart of a process of forming a zirconium oxide film using a substrate processing apparatus according to another exemplary embodiment of the present invention.
Figure 8:
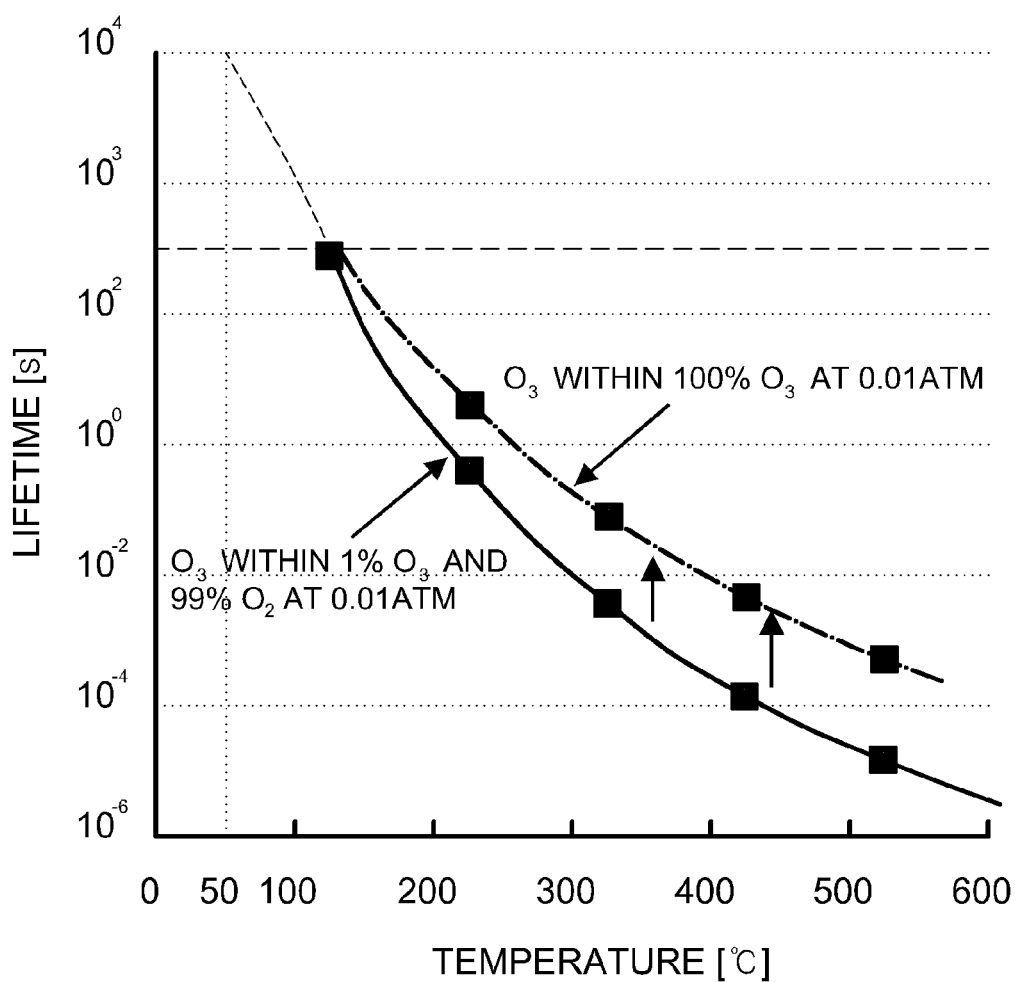
FIG. 8 is a graph showing the relationship between an environmental temperature and the lifetime of $O_3$ gas.

Also, as illustrated in FIG. 6, steps S105 and S106 are performed in parallel with supply of $O_3$ gas from the ozonizer 220 into the gas tank 603c and storage of the $O_3$ gas in the gas tank 603c. Also, in this case, the temperature in the gas tank 603c is maintained to be 50° C. or less. FIG. 8 is a graph showing the relationship between an environmental temperature and the lifetime of $O_3$ gas. As the environment temperature increases, the lifetime of the $O_3$ gas decreases. In order to store the $O_3$ gas for several hours, the temperature in the gas tank 603c is preferably maintained to be 50° C. or less.

<Step S107>

In step S107 (see FIGS. 5 and 6, a third process or an $O_3$ gas supply process), $O_3$ gas is simultaneously supplied into the process chamber 201 from the gas supply holes 250b and 250c of the nozzles 249b and 249c. That the O₃ gas is simultaneously supplied into the process chamber 201 from the gas supply holes 250b and 250c of the nozzles 249b and 249c means that the O₃ gas is supplied at the same timing from the gas supply holes 250b and 250c but timings at which the supplies of the O₃ gas from the gas supply holes 250b and 250c begin and/or timings at which the supplies of the O₃ gas from the gas supply holes 250b and 250c end may not be the same. Also, a time at which the O₃ gas is supplied from the gas supply hole 250b of the nozzle 249b and a time at which the O₃ gas is supplied from the gas supply hole 250c of the nozzle 249c may not be the same.

Specifically, after the gas remaining in the process chamber 201 is removed, the flow rates of the O₃ gas generated by the ozonizer 220 and the O₃ gas stored in the gas tank 603c are adjusted by the MFCs 235b and 235c, and the flow rate adjusted O₃ gases are supplied into the process chamber 201 from the gas supply holes 250b and 250c of the nozzles 249b and 249c and exhausted from the gas the exhaust pipe 231 by opening the valve 233b of the gas supply pipe 232b and the valve 233c and closing the valves 601c and 602c of the vent line 600c and the valve 233i. Also, the valve 233a is opened to supply an inert gas such as N₂ gas from the gas supply pipe 232a, the nozzle 249a, and the gas supply hole 250a, and the valve 233g is opened to supply an inert gas such as N₂ gas from the gas supply pipe 232g, the nozzle 249g, and the gas supply hole 250g. In step S107, the valve 233i may be opened.

When the O₃ gas is supplied, the APC valve 231a is appropriately controlled to set the pressure in the process chamber 201 to be, for example, in the range of 50 to 500 Pa. The supply flow rate of the O₃ gas controlled by the MFCs 235b and 235c is set to be, for example, in the range of 5 to 30 slm. A duration for which the wafers 200 are exposed to the O₃ gas, i.e., a gas supply time (radiation time), is set to be, for example, in the range of 10 to 300 seconds. In this case, the temperature of the heater unit 207 is set such that the temperatures of the wafers 200 are in the range of 150 to 300° C., similar in step S105. When the O₃ gas is supplied, the zirconium containing layer formed on the wafers 200 in step S105 is oxidized to form a ZrO layer.

<Step S108>

In step S108 (see FIGS. 5 and 6, a third process), the supply of the O₃ gas into the process chamber 201 is stopped and the O₃ gas is supplied into the gas tank 603c by closing the valve 233c of the gas supply pipe 232b and opening the valve 233i, the valve 233f, and the valve 602c. In this case, the inside of the process chamber 201 is vacuum-exhausted using the vacuum pump 231g to eliminate from the process chamber 201 the O₃ gas that does not react or remains after contributing to the oxidization of the zirconium containing layer while the APC valve 31a of the gas the exhaust pipe 231 is open. Also, when the pressure in the gas tank 603c reaches a predetermined pressure, the valve 602c is closed and the valve 601c is opened to cause the remnant O₃ gas to flow into the vent line 600c. Also, in this case, the N₂ gas is continuously supplied as the inert gas into the process chamber 201 while the valve 233g is open. The N₂ gas acts as a purge gas to increase the effect of eliminating from the process chamber 201 the O₃ gas that does not react or remains after contributing to the formation of the ZrO layer.

In this case, the gas remaining in the process chamber 201 may not be completely eliminated and the inside of the process chamber 201 may not be completely purged. When a small amount of gas remains in the process chamber 201, step S105 to be performed thereafter will not be badly influenced by the gas. In this case, the flow rate of the N₂ gas to be supplied into the process chamber 201 need not be high. For example, the inside of the process chamber 201 may be purged without causing step S105 to be badly influenced by the gas by supplying an amount of a gas corresponding to the capacity of the reaction tube (particularly, the process chamber 201). As described above, when the inside of the process chamber 201 is not completely purged, a purge time may be reduced to improve the throughput. Furthermore, the consumption of the N₂ gas may be suppressed to a necessary minimum level.

Also, as illustrated in FIG. 6, O₃ gas is supplied to the gas tank 603c from the ozonizer 220 and stored in the gas tank 603c, in parallel with performing step S108. Also, FIG. 6 illustrates a case in which the O₃ gas is continuously stored from step S108 to step S106 of a next cycle. In some cases, the ZrO film forming process may be completed by performing step S108.

By performing one cycle including steps S105 to S108 described above at least once (step S109), a high-k film containing zirconium and oxygen, i.e., a ZrO film, may be formed on the wafer 200 to a predetermined thickness. The cycle described above may be repeatedly performed a plurality of times. Accordingly, the ZrO film may be formed on the wafer 200 to the predetermined thickness.

After the ZrO film is formed, the valve 243a of the gas supply pipe 232a is closed, the valve 233b of the gas supply pipe 232b is closed, the valve 233c of the gas supply pipe 232c is closed, the valve 233a of the inert gas supply pipe 232a is opened, and the valve 233g of the inert gas supply pipe 232g is opened to supply N₂ gas into the process chamber 201. The N₂ gas acts as a purge gas to purge the inside of the process chamber 201 with the inert gas, thereby removing a gas remaining in the process chamber 201 from the process chamber 201 (purging, step S110). Thereafter, an atmosphere in the process chamber 201 is replaced with the inert gas and thus the pressure in the process chamber 201 is recovered to normal pressure (atmospheric pressure recovery, step S111).

Then, when the seal cap 219 is moved downward by the boat elevator 115, the lower end of the manifold 209 is opened and the processed wafers 200 are unloaded to the outside of the process tube 205 from the lower end of the manifold 209 while being retained on the boat 217 (boat unloading, step S112). Thereafter, the processed wafers 200 are unloaded from the boat 217 (wafer discharging, step S113).

A high-k film is formed on a substrate by performing the process described above.

Also, as illustrated in FIG. 8 (as cited from the materials of the 9$^{th}$ ozone research seminar held in 2007), when O₃ gas is supplied from the ozonizer 220 into the gas tank 603c and stored in the gas tank 603c in parallel with performing steps S105 and S106, the O₃ gas is preferably stored in the gas tank 603c until the pressure in the gas tank 603c reaches a predetermined pressure. In this case, remnant O₃ gas remaining when the pressure in the gas tank 603c is greater than the predetermined pressure is exhausted from the vent line 600c to the ozone killer without passing the process chamber 201.

Specifically, after a gas remaining in the process chamber 201 is removed, the flow rates of the O₃ gas generated by the ozonizer 220 and the O₃ gas stored in the gas tank 603c are adjusted by the MFCs 235b and 235c and the flow rate adjusted O₃ gases are supplied into the process chamber 201 via the gas supply holes 250b and 250c of the nozzles 249b and 249c and exhausted from the exhaust pipe 231 by opening the valve 233c of the gas supply pipe 232b and closing the valves 601c, 602c, and 233i. Also, the valve 233a is opened to supply an inert gas such as $N_2$ gas from the gas supply pipe 232a, the nozzle 249a, and the gas supply hole 250a, and the valve 233g is opened to supply an inert gas such as $N_2$ gas from the gas supply pipe 232g, the nozzle 249g, and the gas supply hole 250g.

When the $O_3$ gas is supplied into the process chamber 201 in step S107, a pressure required to control the flow rate of the $O_3$ gas by the MFC 235c may be monitored, and whether the $O_3$ gas is to be supplied into the process chamber 201 may be controlled according to standards. Based on the pressure required for the flow rate control, the valve 233c of the gas supply pipe 232b may be appropriately closed and the valve 601c may be appropriately opened to cause the $O_3$ gas to flow from vent line 600c to the ozone killer.

Although a case in which two nozzles, e.g., the nozzles 249b and 249c, are installed to supply the $O_3$ gas into the process chamber 201 has been described above, for example, both ends of the gas supply pipe 232c may be connected to the gas supply pipe 232b and only the nozzle 249b may be used to supply the $O_3$ gas into the process chamber 201. However, in this case, since the pressure in the gas supply pipe 232b is high, it may be difficult to supply the $O_3$ gas via the gas supply pipe 232c including the gas tank 603c. Thus, nozzles are preferably installed in the process chamber 201 by using a gas supply line at which a gas tank is installed and a gas supply line at which a gas tank is not installed as separate lines. Also, an upper limit of the flow rate of the $O_3$ gas to be supplied into one nozzle is determined by the conductance of a nozzle or the like.

The capacity of the gas tank 603c may be set to be sufficient to store the amount of $O_3$ gas to be supplied in step S107, and is preferably set to store the amount of $O_3$ gas required in one step or several steps. For example, the capacity of the gas tank 603c may be 1 liter or more, and preferably, 50 liters or more, e.g., about 150 liters.

(Effects of the Present Embodiment)

According to the present embodiment, one or more effects which will be described below may be achieved.

(a) According to the present embodiment, the supply rate of $O_3$ gas may be increased and a fine structure formed on a wafer may be uniformly processed.

(b) Also, the supply rate of $O_3$ gas may be increased without increasing the number of ozonizers.

(c) Also, the flow rate of $O_3$ gas may be precisely controlled using each of gas supply systems by installing a second reactive gas supply system independently from a first reactive gas supply system.

(d) Also, since a general ozonizer cannot generate $O_3$ gas or stop generation of the $O_3$ gas within a short time period, the $O_3$ gas is detoxified by supplying it to an abatement facility via a vent line when the $O_3$ gas is to be supplied into a process chamber. Although this lowers the efficiency of using the $O_3$ gas, $O_3$ gas that has been discarded may be stored and used to form a film by installing a gas tank, thereby increasing the efficiency of using the $O_3$ gas.

(e) Also, the amount of $O_3$ gas to be discarded may be reduced, thereby reducing the load on an abatement device.

(f) Also, the pressure in the gas tank may be prevented from abnormally increasing by installing a pressure sensor at the gas tank. Also, a gas is controlled to be supplied from the gas tank at a constant flow rate.

(g) Also, $O_3$ gas generated at times other than a time (timing) at which $O_3$ gas is supplied into the process chamber may be stored in the gas tank and supplied into the process chamber together with $O_3$ gas generated in real time by the ozonizer. Thus, a large amount of $O_3$ gas that is greater than the amount of $O_3$ gas that the ozonizer can generate may be supplied into the process chamber.

(Second Embodiment)

Figure 10:
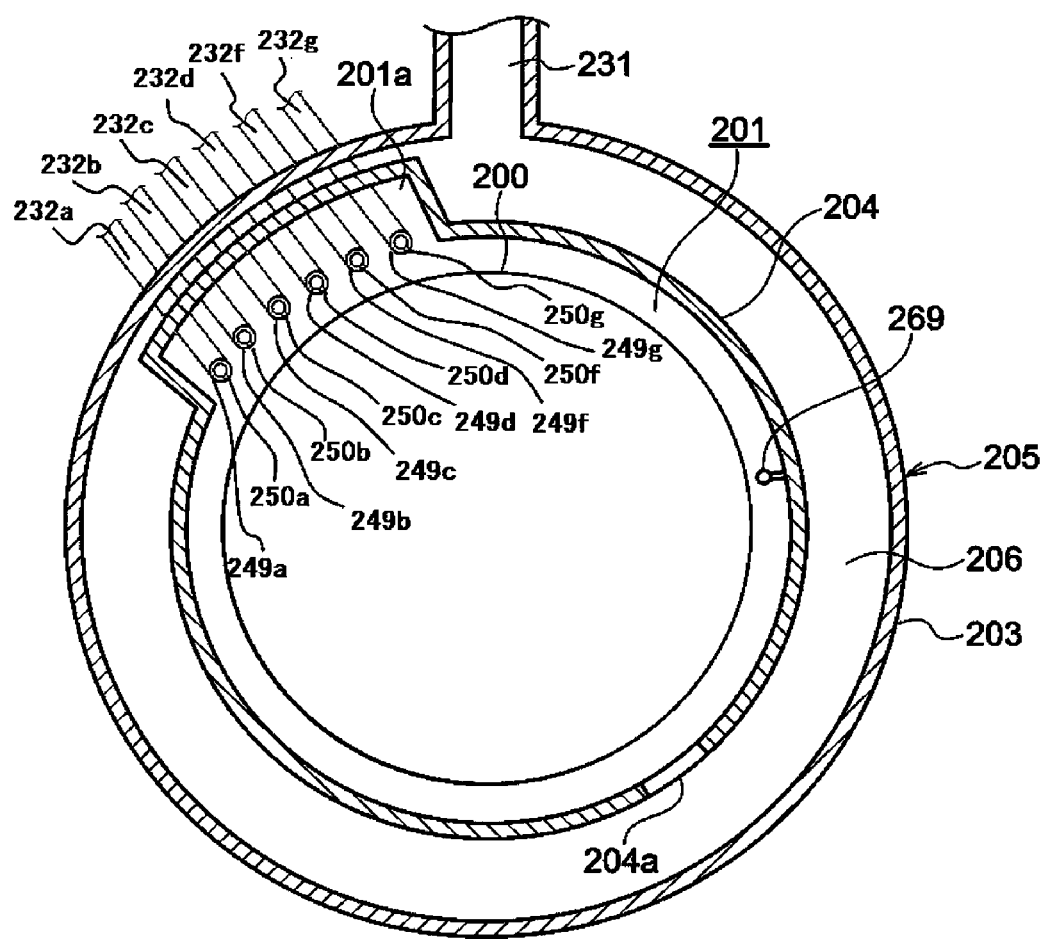
FIG. 10 is a schematic cross-sectional view taken along line A-A of the process furnace portion of the vertical process furnace of FIG. 1 according to another exemplary embodiment of the present invention.

A second embodiment of the present invention will be described with reference to FIGS. 3 and 10 below. FIG. 10 illustrates the structure of a process furnace 202 according to the second embodiment of the present invention. In the present embodiment, two $O_3$ gas supply line systems including gas tanks are included in a reactive gas supply system, compared to the first embodiment in which one $O_3$ gas supply line system including gas tanks is included in a reactive gas supply system. That is, the reactive gas supply system is configured to include three $O_3$ gas supply line systems. Particularly, a third reactive gas supply system including a gas supply pipe 232f is installed as illustrated in FIG. 3. The other elements of the second embodiment are the same as those of the first embodiment. In FIG. 10, elements that are substantially the same as those of FIGS. 1 to 3 are assigned the same reference numerals and are not described again here. The structure of the process furnace 202 according to the present embodiment will now be described in detail.

At the gas supply pipe 232f, a vent line 600f configured to exhaust a gas to an ozone killer, a valve 601f configured to control supply of a gas to the ozone killer to be 'on'/'off', a valve 602f, a gas tank 603f, a pressure sensor 604f configured to measure the pressure in the gas tank 603f, an MFC 235f, and a valve 233f are sequentially installed in an upstream direction. A gas is supplied into the gas tank 603f, for example, in the upstream direction, and stored in the gas tank 603f until the inside of the gas tank 603f has a predetermined pressure. The flow rate of the gas from the gas tank 603f is adjusted by the MFC 235f, and $O_3$ gas is supplied into the process chamber 201 via the valve 233f. As illustrated in FIG. 10, a nozzle 249f is connected to the gas supply pipe 232f. The nozzle 249f has the same shape as a nozzle 249a and the like. In the nozzle 249f, a gas supply hole 250f is formed. The third reactive gas supply system mainly includes the nozzle 249f, the gas supply pipe 232f, the MFC 235f, the valve 233f, the gas tank 603f, and the pressure sensor 604f. Also, the valve 601f, the valve 602f, and the vent line 600f may be further included in the third reactive gas supply system so that surplus $O_3$ gas generated when the pressure in the gas tank 603f is equal to or greater than the predetermined pressure may be exhausted to the ozone killer via the vent line 600f, if needed.

Also, a valve 233h and a valve 233i may be installed at a gas supply pipe 232h. By controlling the valve 233h and the valve 233i to be opened/closed, whether one of or both a second reactive gas supply system and a third $O_3$ gas supply system are to be used may be controlled.

By configuring the process furnace 202 as described above, the MFC 235f, the valves 233f, 233h, 233i, and 601f and the pressure sensor 604f are connected to the I/O port 280d described above, and the CPU 280a controls the MFC 235f to adjust the flow rates of various gases, controls the valves 233f, 233h, 233i, and 601f to be opened/closed, and controls the pressure in the gas tank 603f using the pressure sensor 604f, based on a process recipe read from the memory device 280c, according to a manipulation command received via the I/O device 282.

A plurality of $O_3$ gas supply lines at which a gas tank is installed (two or three or more $O_3$ gas supply line systems) may be installed as described above. That is, a total of three or four or more $O_3$ gas supply line systems may be installed. A desired amount of $O_3$ gas may be supplied into the wafers 200 within a shorter time by determining the number of $O_3$ gas supply lines at which a gas tank is installed, based on various conditions such as a desired supply rate of $O_3$ gas to be supplied into the wafers 200, the performance of the ozonizer 220, and the pressure in each gas supply pipe. When a plurality of $O_3$ gas supply lines are installed, $O_3$ gas may start to be supplied from the plurality of $O_3$ gas supply lines at the same timing or different timings, and the supplies of the $O_3$ gas may be stopped at the same timing or different timings. Otherwise, $O_3$ gas may be sequentially supplied from the plurality of $O_3$ gas supply lines.

(Third Embodiment)

Figure 11:
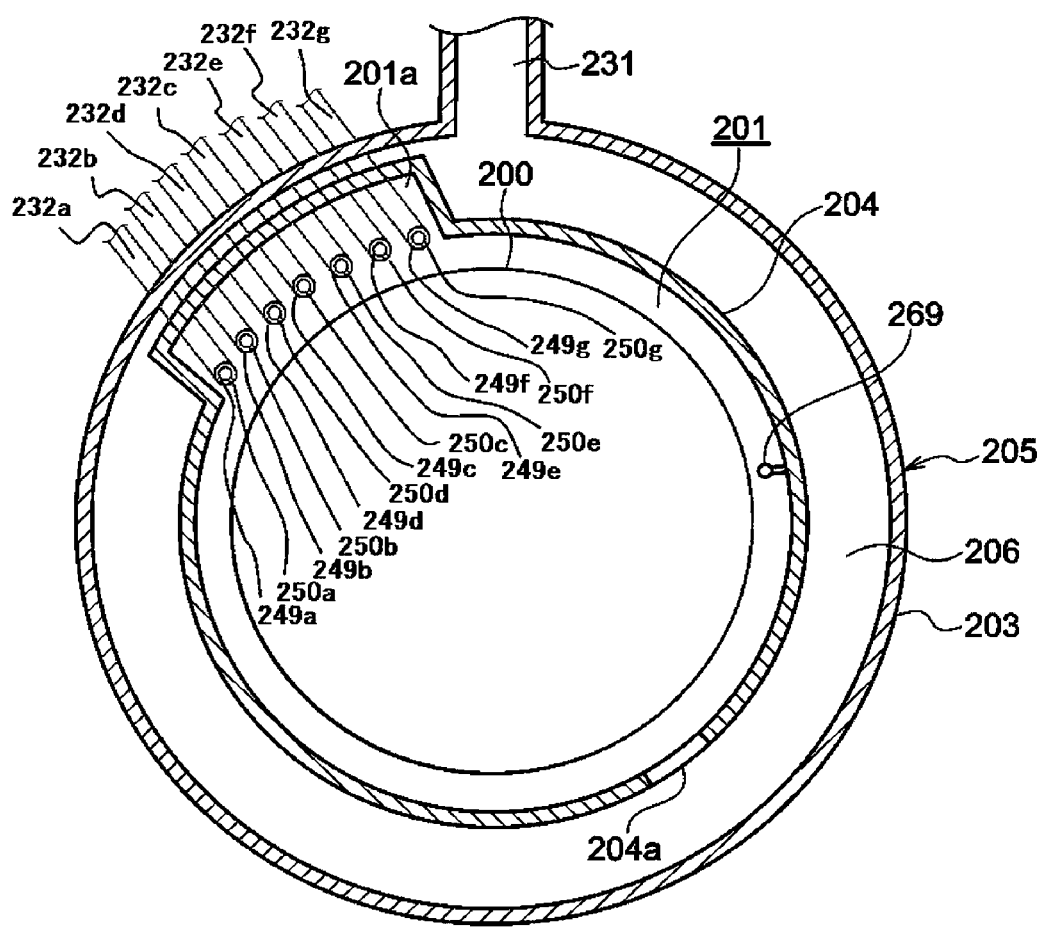
FIG. 11 is a schematic cross-sectional view taken along line A-A of the process furnace portion of the vertical process furnace of FIG. 1 according to another exemplary embodiment of the present invention.

A third embodiment of the present invention will now be described with reference to FIGS. 3 and 11. FIG. 11 illustrates the structure of a process furnace 202 of a substrate processing apparatus according to the third embodiment. In the previous first embodiment, an example of a substrate processing apparatus in which one source gas supply system is installed has been described, but in the present embodiment, two source gas supply systems are installed in a substrate processing apparatus. That is, as illustrated in FIG. 3, a second source gas supply system including a gas supply pipe 232d may be installed in the substrate processing apparatus according to the present embodiment. The other elements of the third embodiment are the same as those of the first or second embodiment. In FIG. 11, elements that are substantially the same as those of FIGS. 1 to 3 are assigned the same reference numerals and are not described again here. The structure of the process furnace 202 of the substrate processing apparatus according to the present embodiment will now be described in detail.

At a gas supply pipe 232e, elements such as those installed at the gas supply pipe 232d are installed. That is, at the gas supply pipe 232e, a vaporizer 270e is installed and a valve 233e which is an opening/closing valve and a gas filter 301e are sequentially installed at a downstream side of the vaporizer 270e. As illustrated in FIG. 11, a nozzle 249e is connected to a front end of the gas supply pipe 232e. The nozzle 249e has the same shape as a nozzle 249a, and a gas supply hole 250e is installed in the nozzle 249e. A second source supply system mainly includes the nozzle 249e, the valve 233e, the gas supply pipe 232e, and the gas filter 301e. The vaporizer 207e may be further included in the second source gas supply system. A second liquid source supply system or a second carrier gas supply system which will be described below may be further included in the second source gas supply system. A second source gas may be the same as or different from a first source gas.

(Second Liquid Source Supply System)

A liquid source tank 291e, a LMFC 295e, and a valve 293e are installed at the gas supply pipe 232e upstream from the vaporizer 270e. The supply rate of a liquid source into the vaporizer 270e (i.e., the supply flow rate of a vapor gas vaporized by the vaporizer 270e and supplied into the process chamber 201) is controlled by the LMFC 295e. A second liquid source supply system mainly includes the gas supply pipe 232e, the LMFC 295e, and the valve 294e. The liquid source tank 291e may be further included in the second liquid source supply system.

(Second Carrier Gas Supply System)

An inert gas is supplied as a carrier gas to the vaporizer 270e from a gas supply pipe 232k. At the gas supply pipe 232k, a valve 233k and an MFC 235k are installed. When a vapor gas generated by the vaporizer 270e is diluted with the carrier gas, the uniformity of processing the wafers 200 loaded in the boat 217, e.g., the uniformity of a film thickness between the wafers 200, may be controlled. A second carrier gas supply system mainly includes the gas supply pipe 232k, the valve 233k, and the MFC 235k.

By configuring the process furnace 202 as described above, the MFCs 235e and 235k, the valves 233e, 233k, and 294e, the vaporizer 207e, and the LMFC 295e are connected to the I/O port 280d described above, and the CPU 280a controls the MFCs 235e and 235k to adjust the flow rates of various gases, controls the valves 233e, 233k, and 294e to be opened/closed, and controls the vaporizer 207e to vaporize a liquid source, based on a process recipe read from the memory device 280c, according to a manipulation command received via the I/O device 282.

By installing the second source gas supply system as described above, a film may be formed on the wafer 200 using two types of source gases. That is, a three-component compound such as a zirconium aluminum oxide film (ZrAlO film) may be formed using TEMAZ gas a first source gas, $O_3$ gas as a first reactive gas, and for example, trimethylaluminum [Al(CH$_3$)$_3$, abbreviated as 'TMA'] gas as a second source gas. Otherwise, another element may be doped onto a two-component compound.

EXAMPLE

Figure 9:
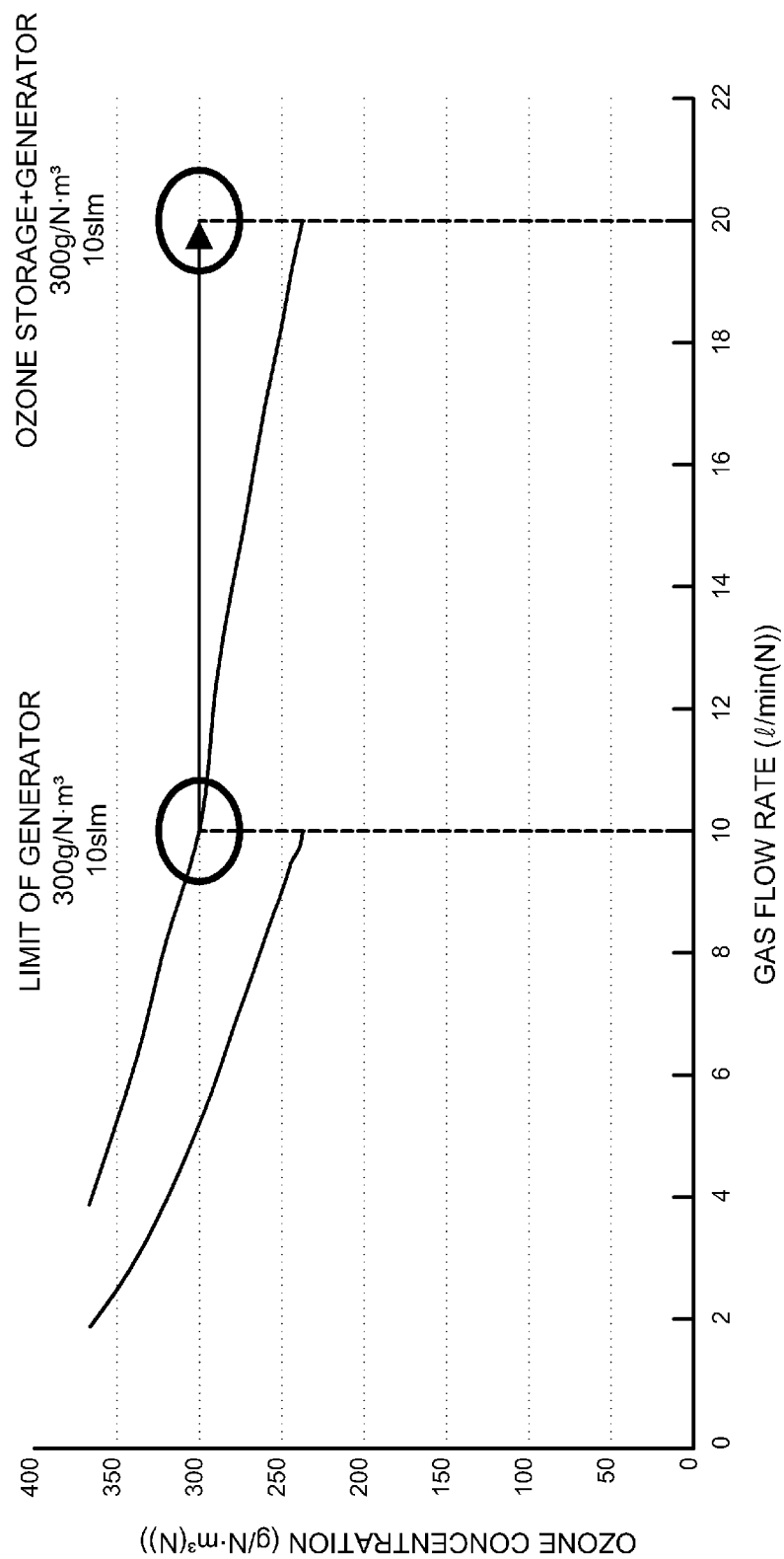
FIG. 9 is a graph comparing the flow rate of $O_3$ gas when the related art is used with the flow rate of $O_3$ gas when a substrate processing apparatus and sequence according to an exemplary embodiment of the present invention are used.

A HfO film was formed on a wafer using the substrate processing apparatus and sequence according to the first embodiment, and a limited value of an ozonizer (ozone generator) with respect to the flow rate of $O_3$ gas was compared with the supply rate of $O_3$ gas supplied into a process chamber by supplying the $O_3$ gas into the process chamber from the ozonizer while storing $O_3$ gas using a gas tank. A comparison result is illustrated in FIG. 9. In the present embodiment, the HfO film was formed by using TEMAH gas as a source gas and $O_3$ gas as a reactive gas according to the film forming flow of FIG. 5 and the gas supply timing of FIG. 6.

In step S107, $O_3$ gas was supplied into a process chamber from a first reactive gas supply pipe (an ozone generator of FIG. 9) at a supply rate of 10 slm and a concentration of 300 g/N·m$^3$ for one minute. In this case, a gas tank having a capacity of 10 liters or more was installed at a second reactive gas supply pipe, and $O_3$ gas was similarly supplied to the gas tank for one minute. As illustrated in FIG. 8, a general ozone generator is capable of supplying $O_3$ gas only at a low flow rate when the concentration of $O_3$ gas and an allowed gas flow rate are inversely proportional to each other and high-concentration $O_3$ gas is supplied. In contrast, when a gas tank is used as in the present embodiment, $O_3$ gas can be supplied at a flow rate that is twice or more than when the general ozone generator is used.

An appropriate combination of the embodiments, modified examples, and application examples described above may be used. The present invention is not limited to the embodiments set forth herein and may be embodied in various different forms without departing from the scope of the present invention.

Cases in which a film is formed using a substrate processing apparatus which is a batch-type vertical apparatus capable of processing a plurality of substrates at once have been described in the previous embodiments. However, the present invention is not limited thereto and is preferably applicable to a case in which a film is formed using a single-wafer type substrate processing apparatus capable of processing one or several substrates at once. Also, although cases in which a film is formed using a substrate processing apparatus including a hot wall type process furnace have been described in the previous embodiments, the present invention is not limited thereto and is preferably applicable to forming a film using a substrate processing apparatus including a cold wall type process furnace.

Also, the present invention is applicable to any type of gas having a low vapor pressure other than TEMAZ gas. For example, tetrakis(ethylmethylamino)zirconium ($Zr[N(CH_3)C_2H_5]_4$, abbreviated as 'TEMAZ'), tetrakis(diethylamino)zirconium ($Zr[N(C_2H_5)_2]_4$, abbreviated as 'TDEAZ'), tetrakis(dimethylamino)zirconium ($Zr[N(CH_3)_2]_4$, abbreviated as 'TDMAZ') $Zr(MeCp)(NMe_2)_3$, tetrakis(ethylmethylamino)hafnium ($Hf[N(CH_3)C_2H_5]_4$, abbreviated as 'TEMAH'), tetrakis(diethylamino)hafnium ($Hf[N(C_2H_5)_2]_4$, abbreviated as 'TDEAH'), tetrakis(dimethylamino)hafnium ($Hf[N(CH_3)_2]_4$, abbreviated as 'TDMAH'), trimethyl aluminum ($Al(CH_3)_3$, abbreviated as 'TMA'), titanium tetrachloride ($TiCl_4$), tris(dimethylamino)silane (TDMAS), tantalum chloride (TaCl), nickel Bis[N,N"-ditertialbutylacetamidinate] [BDTBANi, $Ni(tBu_2\text{-amd})_2$, $(tBu)NC(CH_3)N (tBu)_2Ni$], Co amd[$(tBu)NC(CH_3)N (tBu)_2Co$], 2, 4-dimethyl pentadienyl) (ethylcyclopentadienyl) ruthenium (DER), or the like is preferably applicable.

Also, although cases in which an oxide film is formed using $O_3$ gas (an oxidizing gas) as a reactive gas have been described in the previous embodiments, the present invention is not limited thereto and is preferably applicable to an oxidizing gas or a nitriding gas, such as oxygen ($O_2$), vapor ($H_2O$), hydrogen peroxide ($H_2O_2$), nitrous oxide ($N_2O$), a combination of oxygen ($O_2$) and hydrogen ($H_2$), ammonia ($NH_3$), or nitrogen ($N_2$).

Also, the present invention is applicable to any type of film using a low vapor pressure source other than a ZrO film. For example, the present invention is preferably applicable to forming a hafnium oxide film (HfO film), an aluminum oxide film (AlO film), a titanium oxide film (TiO film), a ruthenium oxide film (RuO film), a titanium nitride film (TiN film), a tantalum nitride film (TaN film), a cobalt film (Co film), a nickel film (Ni film), or a ruthenium film (Ru film) using the source described above. Also, the present invention is applicable to forming a three-component compound, such as a zirconium silicon oxide film (ZrSiO film), a hafnium silicon oxide film (HfSiO film), a zirconium aluminum oxide film (ZrAlO film), a hafnium aluminum oxide film (HfAlO film), or a titanium carbonitride film (TiCN film) that is a combination of these films described above. Otherwise, another element may be doped to a two-component compound.

In addition to $N_2$ gas, a rare gas such as Ar gas, He gas, Ne gas, or Xe gas may be used as an inert gas.

Also, the present invention is applicable to changing a process recipe by modifying, for example, a gas supply system of the existing substrate processing apparatus. In order to change a process recipe stored in the existing substrate processing apparatus, a process recipe according to the present invention may be installed in the existing substrate processing apparatus via an electrical communication line or a recording medium storing the process recipe or the process recipe stored in the existing substrate processing apparatus may be replaced with the process recipe according to the present invention by manipulating an I/O device of the existing substrate processing apparatus.

Although film forming techniques according to various embodiments of the present invention have been described above, the present invention is not limited thereto. For example, the present invention is applicable to not only a film forming process of forming various films such as an oxide film, a nitride film, a metal film, etc. but also other substrate processing such as diffusion treatment, oxidization, nitridation, lithography, etc. Also, the present invention is applicable to various other substrate processing apparatuses such as an annealing processing apparatus, a thin film forming apparatus, an etching apparatus, an oxidization treatment apparatus, a nitridation treatment apparatus, a coating apparatus, a heating apparatus, etc. Also, the present invention is applicable to combinations of these apparatuses. Accordingly, the scope of the present invention is defined only in the claims attached herein.

The following supplementary notes are added herein as exemplary embodiments of the present invention.

(Supplementary Note 1)

According to one aspect of the present invention, there is provided a substrate processing apparatus including a process chamber in which a substrate is accommodated; a source gas supply system configured to supply a source gas onto the substrate; a first reactive gas supply system configured to supply a reactive gas onto the substrate via a first reactive gas supply pipe; a second reactive gas supply system configured to supply the reactive gas onto the substrate via a second reactive gas supply pipe connected to the first reactive gas supply pipe, wherein a first gas storage unit is installed at the second reactive gas supply pipe to store the reactive gas and the reactive gas is supplied onto the substrate via the first gas storage unit; and a control unit configured to control the source gas supply system, the first reactive gas supply system, and the second reactive gas supply system to supply the source gas onto the substrate and supply the reactive gas onto the substrate from the first and second reactive gas supply pipes.

(Supplementary Note 2)

The control unit is preferably configured to control the first reactive gas supply system and the second reactive gas supply system to store the reactive gas in the first gas storage unit simultaneously with supplying the source gas onto the substrate.

(Supplementary Note 3)

The first reactive gas supply system preferably includes a reactive gas activation device installed at the first reactive gas supply pipe upstream from an interface between the first and second reactive gas supply pipes, and the control unit is preferably configured to control the first and second reactive gas supply systems to store the reactive gas in the first gas storage unit from the reactive gas activation device via the second reactive gas supply pipe when the source gas is supplied onto the substrate.

(Supplementary Note 4)

The control unit is preferably configured to control the first and second reactive gas supply systems to alternately perform the supplying of the source gas onto the substrate and the supplying of the reactive gas onto the substrate a plurality of times.

(Supplementary Note 5)

The second reactive gas supply system preferably includes a pressure gauge installed at the first gas storage unit, and a vent line connected to the second reactive gas supply pipe between the reactive gas activation device and the first gas storage unit, and the control unit is configured to supply the reactive gas to the vent line by stopping the supply of the reactive gas into the first gas storage unit when the reactive gas is stored in the first gas storage unit and the pressure gauge has a predetermined value.

(Supplementary Note 6)

The reactive gas is preferably an oxidizing gas.

(Supplementary Note 7)

The oxidizing gas is preferably an oxygen gas, the reactive gas activation device is preferably an ozonizer, and the oxidizing gas supplied into the process chamber via the reactive gas activation device is preferably ozone.

(Supplementary Note 8)

The substrate processing apparatus preferably further includes a third reactive gas supply system connected to the first reactive gas supply pipe and configured to supply the reactive gas onto the substrate via a third reactive gas supply pipe, wherein a second gas storage is installed at the third reactive gas supply pipe to store the reactive gas and the reactive gas is supplied onto the substrate via the second gas storage unit, and the control unit is configured to control the first to third reactive gas supply systems to supply the reactive gas onto the substrate from the first reactive gas supply pipe, the second reactive gas supply pipe, and the third reactive gas supply pipe when the reactive gas is supplied onto the substrate.

(Supplementary Note 9)

According to another aspect of the present invention, there is provided a substrate processing apparatus including a process chamber in which a substrate is accommodated; a first reactive gas supply line connected to the process chamber and configured to supply a reactive gas onto the substrate accommodated in the process chamber; a first valve for opening or closing the first reactive gas supply line; a second reactive gas supply line including one end connected to the first reactive gas supply line at an upstream side of the first valve and the other end connected to the process chamber, and configured to supply the reactive gas onto the substrate accommodated in the process chamber; a gas storage unit installed at the second reactive gas supply line; a second valve installed between the first reactive gas supply line and the gas storage unit, and configured to open or close the second reactive gas supply line; a third valve installed between the gas storage unit and the process chamber and configured to open or close the second reactive gas supply line; and a control unit configured to control the first to third valves such that the reactive gas is stored in the gas storage unit by opening the second valve in a state in which the first and third valves are closed and is supplied onto the substrate simultaneously from the first and second reactive gas supply lines by opening the first and third valves.

(Supplementary Note 10)

The reactive gas is preferably supplied onto the substrate in a state in which the second valve is open.

(Supplementary Note 11)

The reactive gas is preferably supplied onto the substrate in a state in which the second valve is closed.

(Supplementary Note 12)

The substrate processing apparatus preferably further includes a source gas supply line via which a source gas is supplied onto the substrate accommodated in the process chamber, and a fourth valve for opening or closing the source gas supply line; and the control unit is preferably configured to control the first to fourth valves such that the source gas is supplied onto the substrate accommodated in the process chamber from the source gas supply line by opening the fourth valve in a state in which the first valve is closed, and the reactive gas is stored in the gas storage unit by opening the second valve in a state in which the first and third valves are closed and is sequentially supplied onto the substrate from the first and second reactive gas supply lines by opening the first and third valves.

(Supplementary Note 13)

The control unit is preferably configured to control the first to fourth valves to perform the supplying of the source gas onto the substrate and the storing of the reactive gas in the gas storage unit at the same time.

(Supplementary Note 14)

According to another aspect of the present invention, there is provided a substrate processing apparatus including a process chamber in which a substrate is accommodated; a first reactive gas supply system configured to supply a reactive gas onto the substrate; a second reactive gas supply system connected to the first reactive gas supply system, including a gas tank for storing the reactive gas, and configured to supply the reactive gas onto the substrate; and a control unit configured to control the source gas supply system, the first reactive gas supply system, and the second reactive gas supply system to process the substrate in the process chamber by storing the reactive gas in the gas tank, and supplying the reactive gas stored in the gas tank onto the substrate via the second reactive gas supply system together with supplying the reactive gas onto the substrate via the first reactive gas supply system.

(Supplementary Note 15)

According to another aspect of the present invention, there is provided a substrate processing apparatus including a process chamber in which a substrate is accommodated; a source gas supply system configured to supply a source gas onto the substrate; a first reactive gas supply system configured to supply a reactive gas onto the substrate; a second reactive gas supply system connected to the first reactive gas supply system, including a gas tank for storing the reactive gas, and configured to supply the reactive gas onto the substrate; and a control unit configured to control the source gas supply system, the first reactive gas supply system, and the second reactive gas supply system to form a film on the substrate by supplying the source gas onto the substrate in the process chamber, storing the reactive gas in the gas tank, and supplying the reactive gas stored in the gas tank onto the substrate via the second reactive gas supply system together with supplying the reactive gas onto the substrate via the first reactive gas supply system.

(Supplementary Note 16)

According to another aspect of the present invention, there is provided a method of manufacturing a semiconductor device, the method including a process of supplying a source gas onto a substrate accommodated in a process chamber; a process of supplying a reactive gas onto the substrate simultaneously from a first reactive gas supply pipe and a second reactive gas supply pipe at which a gas storage unit is installed; and a process of storing the reactive gas in the gas storage unit.

(Supplementary Note 17)

The process of supplying the source gas and the process of storing the reactive gas in the gas storage unit are preferably simultaneously performed.

(Supplementary Note 18)

In the process of storing the reactive gas, the reactive gas is preferably stored in the gas storage unit via a reactive gas activation device installed at the first reactive gas supply pipe.

(Supplementary Note 19)

According to another aspect of the present invention, there is provided a method of manufacturing a semiconductor device, the method including a process of processing a substrate by performing a process of storing a reactive gas in a gas tank connected to a first reactive gas supply line, which is connected to a process chamber and configured to supply a reactive gas, and installed at a second reactive gas supply line; and a process of supplying the reactive gas stored in the gas tank onto the substrate via the second reactive gas supply line together with supplying the reactive gas onto a substrate accommodated in the process chamber via the first reactive gas supply line.

(Supplementary Note 20)

According to another aspect of the present invention, there is provided a method of manufacturing a semiconductor device, the method including a process of forming a film on a substrate by performing a process of supplying a source gas onto the substrate accommodated in a process chamber; a process of storing a reactive gas in a gas tank connected to a first reactive gas supply system, which is connected to the process chamber and configured to supply the reactive gas, and installed at a second reactive gas supply system; and a process of supplying the reactive gas stored in the gas tank onto the substrate via the second reactive gas supply line together with supplying the reactive gas onto the substrate via the first reactive gas supply system.

(Supplementary Note 21)

According to another aspect of the present invention, there is provided an ozone supply mechanism which supplies ozone into a process chamber in which a substrate is accommodated, the ozone supply mechanism including a first mechanism configured to supply ozone generated by an ozone generator into the process chamber in real time; a second mechanism configured to store ozone generated at times other than a time at which ozone is supplied into the process chamber; and a control unit configured to control the first and second mechanisms to simultaneously supply the ozone generated in real time and the stored ozone into the process chamber.

(Supplementary Note 22)

According to another aspect of the present invention, there is provided a reactive gas supply system including a reactive gas activation apparatus; a first nozzle connected to the activation apparatus and configured to supply a reactive gas activated by the activation apparatus onto a substrate; and a second nozzle connected to the activation apparatus, including a gas tank for storing the activated reactive gas, and configured to supply the reactive gas onto the substrate from the gas tank.

(Supplementary Note 23)

According to another aspect of the present invention, there is provided a program causing a computer to perform a sequence of supplying a source gas onto a substrate accommodated in a process chamber; a sequence of supplying a reactive gas onto the substrate from a first reactive gas supply pipe and a second reactive gas supply pipe; and a sequence of storing the reactive gas in a gas storage unit installed at the second reactive gas supply pipe.

(Supplementary Note 24)

According to another aspect of the present invention, there is provided a non-transitory computer readable recording medium storing a program causing a computer to perform a sequence of supplying a source gas onto a substrate accommodated in a process chamber; a sequence of supplying a reactive gas onto the substrate from a first reactive gas supply pipe and a second reactive gas supply pipe; and a sequence of storing the reactive gas in a gas storage unit installed at the second reactive gas supply pipe.

(Supplementary Note 25)

According to another aspect of the present invention, there is provided a program causing a computer to perform a sequence of supplying a reactive gas onto a substrate from a first reactive gas supply system and a second reactive gas supply system including a gas tank; a sequence of supplying a source gas onto the substrate accommodated in a process chamber; a sequence of storing the reactive gas in the gas tank installed at a second reactive gas supply line connected to a first reactive gas supply line connected to the process chamber and configured to supply the reactive gas; and a sequence of supplying the reactive gas stored in the gas tank onto the substrate via the second reactive gas supply line together with supplying the reactive gas onto the substrate via the first reactive gas supply line.

(Supplementary Note 26)

According to another aspect of the present invention, there is provided a non-transitory computer-readable recording medium storing a program causing a computer to perform a sequence of supplying a reactive gas onto a substrate from a first reactive gas supply system and a second reactive gas supply system including a gas tank; a sequence of supplying a source gas onto the substrate accommodated in a process chamber; a sequence of storing the reactive gas in the gas tank installed at a second reactive gas supply line connected to a first reactive gas supply line connected to the process chamber and configured to supply the reactive gas; and a sequence of supplying the reactive gas stored in the gas tank onto the substrate via the second reactive gas supply line together with supplying the reactive gas onto the substrate via the first reactive gas supply line.

The invention claimed is:

1. A substrate processing apparatus comprising:
   a process chamber configured to accommodate a substrate;
   a source gas supply system configured to supply a source gas onto the substrate;
   a first reactive gas supply system configured to supply a reactive gas onto the substrate via a first reactive gas supply pipe connected to the process chamber at a first location of the process chamber;
   a second reactive gas supply system configured to supply the reactive gas onto the substrate via a second reactive gas supply pipe having one end connected to the first reactive gas supply pipe and other end connected to the process chamber at a second location of the process chamber different from the first location of the process chamber, and via a gas storage unit installed at the second reactive gas supply pipe and configured to store the reactive gas; and
   a control unit configured to control the source gas supply system, the first reactive gas supply system and the second reactive gas supply system to alternately supply the source gas and the reactive gas onto the substrate,
   wherein the first reactive gas supply system and the second reactive gas supply system are controlled to supply the reactive gas onto the substrate via the first reactive gas supply pipe and the second reactive gas supply pipe simultaneously.

2. The substrate processing apparatus of claim 1, wherein the control unit is further configured to control the first reactive gas supply system and the second reactive gas supply system to store the reactive gas in the gas storage unit when the source gas is supplied onto the substrate.

3. A substrate processing apparatus comprising:
   a process chamber configured to accommodate a substrate;
   a first reactive gas supply line connected to the process chamber at a first location of the process chamber and configured to supply a reactive gas onto the substrate accommodated in the process chamber;
   a first valve configured to open and close the first reactive gas supply line;
   a second reactive gas supply line having one end connected to the first reactive gas supply line at an upstream side of the first valve and other end connected to the process chamber at a second location of the process chamber different from the first location of the process chamber to supply the reactive gas onto the substrate accommodated in the process chamber;
a gas storage unit installed in line with the second reactive gas supply line;
a second valve installed between the first reactive gas supply line and the gas storage unit, and configured to open and close the second reactive gas supply line;
a third valve installed between the gas storage unit and the process chamber and configured to open and close the second reactive gas supply line; and
a control unit configured to open the second valve with the first valve and the third valve closed such that the reactive gas is stored in the gas storage unit, and open the first valve and the third valve when the reactive gas is supplied onto the substrate accommodated in the process chamber such that the reactive gas is supplied onto the substrate via the first reactive gas supply line and the second reactive gas supply line simultaneously.

4. The substrate processing apparatus of claim 1, further comprising a third reactive gas supply system including: a third reactive gas supply pipe having one end connected to the first reactive gas supply pipe and other end connected to the process chamber at a third location different from the first and the second locations of the process chamber; and a second gas storage unit installed in line with the third reactive gas supply pipe,
wherein the control unit is further configured to control the first reactive gas supply system, the second reactive gas supply system and the third reactive gas supply system such that the reactive gas is supplied onto the substrate via the first reactive gas supply pipe, the second reactive gas supply pipe and the third reactive gas supply pipe simultaneously.

5. The substrate processing apparatus of claim 2, wherein the first reactive gas supply system comprises a reactive gas activation device installed in line with the first reactive gas supply pipe at an upstream side of an interface between the first and the second reactive gas supply pipes, and
the control unit is further configured to control the first reactive gas supply system and the second reactive gas supply system such that, when the source gas is supplied onto the substrate, the reactive gas from the reactive gas activation device is stored in the gas storage unit via the second reactive gas supply pipe.

6. The substrate processing apparatus of claim 5, wherein the reactive gas activation device comprises an ozonizer, and the reactive gas supplied onto the substrate via the reactive gas activation device comprises ozone.

7. The substrate processing apparatus of claim 5, wherein the second reactive gas supply system comprises a pressure gauge installed at the gas storage unit, and a vent line connected to the second reactive gas supply pipe between the reactive gas activation device and the gas storage unit, and
the control unit is configured to supply the reactive gas to the vent line by stopping a supply of the reactive gas into the gas storage unit when the reactive gas is stored in the gas storage unit and the pressure gauge is at a predetermined value.

8. The substrate processing apparatus of claim 3, further comprising:
a source gas supply line configured to supply a source gas onto the substrate accommodated in the process chamber; and
a fourth valve configured to open and close the source gas supply line,
wherein the control unit is further configured to control the first valve, the second valve, the third valve and the fourth valve to perform: opening the fourth valve with the first valve closed such that the source gas is supplied onto the substrate in the process chamber via the source gas supply line; opening the second valve with the first valve and the third valve closed such that the reactive gas is stored in the gas storage unit; and opening the first valve and the third valve such that the reactive gas is supplied onto the substrate via the first reactive gas supply line and the second reactive gas supply line simultaneously.

9. The substrate processing apparatus of claim 1, wherein the process chamber is further configured to accommodate a plurality of substrates stacked vertically,
the source gas supply system comprises a source gas nozzle connected to the source gas supply pipe and extending along a stacked direction of the plurality of substrates stacked in the process chamber, the source gas nozzle including a source gas discharge hole configured to discharge the source gas onto the substrates,
the first reactive gas supply system comprises a first reactive gas nozzle connected to the first reactive gas supply pipe and extending along the stacked direction of the plurality of substrates, the first reactive gas nozzle including a first reactive gas discharge hole configured to discharge the reactive gas onto the substrates, and
the second reactive gas supply system comprises a second reactive gas nozzle connected to the second reactive gas supply pipe and extending along the stacked direction of the plurality of substrates, the second reactive gas nozzle including a second reactive gas discharge hole configured to discharge the reactive gas onto the substrates.

10. The substrate processing apparatus of claim 9, further comprising a nozzle accommodating portion installed at an inside wall of the process chamber and projecting outward,
wherein the source gas nozzle, the first reactive gas nozzle, and the second reactive gas nozzle are disposed in the nozzle accommodating portion.

* * * * *